(12) United States Patent
Nomura

(10) Patent No.: US 6,384,318 B1
(45) Date of Patent: May 7, 2002

(54) SOLAR BATTERY MODULE

(75) Inventor: Takuji Nomura, Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/514,406

(22) Filed: Feb. 28, 2000

(30) Foreign Application Priority Data

| | | |
|---|---|---|
| May 31, 1999 | (JP) | 11-152618 |
| May 31, 1999 | (JP) | 11-152619 |
| Jun. 1, 1999 | (JP) | 11-153572 |
| Jun. 1, 1999 | (JP) | 11-153573 |
| Jun. 11, 1999 | (JP) | 11-165882 |
| Jun. 11, 1999 | (JP) | 11-165883 |
| Sep. 27, 1999 | (JP) | 11-272454 |

(51) Int. Cl.$^7$ ............... H01L 31/048; H01L 31/042
(52) U.S. Cl. ............ 136/256; 136/251; 136/246; 136/259; 257/437
(58) Field of Search ............... 136/256, 251, 136/246, 259; 257/437

(56) References Cited

U.S. PATENT DOCUMENTS

| | | | | |
|---|---|---|---|---|
| 4,334,036 A | | 6/1982 | Yonezawa et al. | 525/102 |
| 4,830,879 A | * | 5/1989 | Debsikdar | 136/256 |
| 4,880,677 A | * | 11/1989 | Hecq et al. | 136/256 |
| 5,656,098 A | * | 8/1997 | Ishikawa et al. | 136/256 |
| 6,153,823 A | * | 11/2000 | Shiozaki et al. | 136/249 |

FOREIGN PATENT DOCUMENTS

| | | |
|---|---|---|
| JP | 54-36395 | 3/1979 |
| JP | 57-36109 | 2/1982 |
| JP | 57-205188 | 12/1982 |
| JP | 58-157810 | 9/1983 |
| JP | 63-124331 | 5/1988 |
| JP | 2-180081 | 12/1990 |
| JP | 4-249145 | 9/1992 |
| JP | 6-45628 A * | 2/1994 |
| JP | 6045628 | 2/1994 |
| JP | 6-145453 | 5/1994 |
| JP | 7-168004 | 7/1995 |
| JP | 7-331136 | 12/1995 |
| JP | 10-326903 | 12/1998 |
| JP | 11-74552 A * | 3/1999 |
| JP | 11-74552 | 3/1999 |

* cited by examiner

*Primary Examiner*—Alan Diamond
(74) *Attorney, Agent, or Firm*—Hogan & Hartson, L.L.P.

(57) ABSTRACT

A solar battery module effectively preventing public nuisance caused by reflection of light on the light entering side and method of manufacturing the solar battery module in a simple manner at a low cost are provided. The solar battery module includes a transparent insulating substrate having first and second surfaces, a transparent electrode layer formed on the first surface of the transparent insulating substrate, a photo semiconductor layer formed on the transparent electrode layer, a back electrode layer formed on the photo semiconductor layer, and an anti-glare film having a roughened surface texture formed on the second surface on the transparent insulating substrate to which the light enters. The light receiving surface of the solar battery module having the roughened surface texture has 60° gloss of at most 60.

54 Claims, 5 Drawing Sheets

SOLAR BATTERY MODULE

BACKGROUND OF THE INVENTION

1. Field of the Invention

The present invention relates to a solar battery module and, more specifically, to a solar battery module used for solar power generation.

2. Description of the Background Art

Recently, use of clean energy has attracting much attention, and use of solar batteries has been promoted. Further, along with mass production of solar batteries, manufacturing cost has been reduced. Conventionally, the solar battery has been dominantly used in the form of a solar electricity generation plant where a large number of solar batteries are arranged, or used for securing power supply at a remote location. Recently, it becomes more and more popular to install a solar battery module panel on a house roof or on an outer wall of a building in town, generate power thereby and use the power in the similar manner as the electricity supplied by the conventional electric power company.

Such a solar battery module panel has a plurality of photovoltaic elements resin-sealed between a surface cover glass and a back cover film. Conventionally, a transparent glass having mirror surface has been used as the surface cover glass, causing public nuisance caused by light. In order to solve this problem, use of a figured glass having a particular shape on its surface formed by pressing the glass has been proposed. Japanese Patent Laying-Open No. 11-74552 discloses a method for forming unevenness or roughness on the light entering surface of a glass substrate.

As a structure enabling significant cost reduction of the solar battery module, a solar battery module formed on a substrate has been proposed, which is obtained by successively forming a transparent electrode layer, a semiconductor layer and a back electrode layer from the light entering side in this order, on a transparent insulating substrate having the same size as the surface cover glass. This structure is characterized in that sealing resin to be filled between interconnections of photovoltaic elements and between the elements and the cover glass is unnecessary, and that energy loss caused by light absorption by the surface cover glass and degradation in property caused by yellowing of resin are not experienced.

FIG. 11 is a cross section representing a schematic structure of an example of the conventional solar battery module.

Referring to FIG. 11, the solar battery module includes a transparent insulating substrate 1, a transparent electrode layer 2 formed on a surface different from a light entering surface of transparent substrate 1, a photo semiconductor layer 3 formed on transparent electrode layer 2, and a back electrode layer 4 formed on photo semiconductor layer 3. A photo semiconductor element 5 formed by successive stacking of transparent electrode layer 2, photo semiconductor layer 3 and back electrode layer 4 is divided into a plurality of areas, and the areas are electrically connected in series or in parallel with each other.

The solar battery module is sealed and protected by a filler resin 6 and a back cover film 7, so as to protect photo semiconductor element 5. Further, the solar batteriesealed in this manner has a frame 8 attached thereto.

The process steps for manufacturing the conventional solar battery module structured as described above includes the steps of film formation such as plasma CVD and sputtering, as well as the step of laser processing. In order to stably perform these process steps, the conventional solar battery module has the light entering surface of transparent insulating film 1 made flat.

It has been pointed out, however, that when the conventional solar battery module structured as described above is arranged on a roof or an outer wall of a building, sunlight may possibly be reflected and enter neighboring household dependent on the angle between the sun and the solar battery module, resulting in public nuisance.

In order to solve this problem, use of a figured glass, which scatters light, as the substrate surface has been proposed as described above. When such a glass is to be used, detailed study of the texture specification of the figured glass or special laser processing condition becomes necessary, resulting in increased cost. When unevenness is to be formed on the glass substrate itself as disclosed in Japanese Patent Laying-Open No. 11-74552, glass processing involves high temperature or use of a highly reactive solution such as hydrofluoric acid, and therefore the unevenness cannot be formed after completion of the module. When the glass substrate itself is processed in advance before fabrication of the module, it becomes impossible to laser-cut the semiconductor layer or the electrode layer from the side of the glass substrate. Though blasting is possible as a method of forming unevenness on the glass substrate, blasting deteriorates glass strength.

In the conventional manufacturing of a solar battery module, glass substrates of different lots have different tones. Therefore, the completed solar battery module also has difference in tone.

SUMMARY OF THE INVENTION

An object of the present invention is to provide a solar battery module solving the above described problems, effectively preventing public nuisance caused by light reflection on the light entering side and having uniform tone.

In accordance with an aspect of the present invention, a solar battery module is provided. The solar battery module includes a transparent insulating substrate having first and second surfaces, a first electrode layer formed on the first surface of the transparent insulating substrate, a photosemiconductor layer formed on the first electrode layer, a second electrode layer formed on the photosemiconductor layer, and an anti-glare film formed on the second surface, to which light enters, of the transparent insulating substrate.

The anti-glare film includes an organic material binder and organic particles, an organic material binder and inorganic material particles, an inorganic material binder and organic material particles, or an inorganic material binder and inorganic material particles.

Preferably, the organic material binder contains an acrylic resin, a fluororesin, or a mixed resin thereof. For example, the acrylic resin of said organic binder includes an acryl copolymer containing a hydrolyzable silyl, containing a group represented by the following molecule structure:

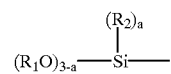

(in the formula, $R_1$ represents an alkyl having 1 to 10 carbon atoms, $R_2$ represents a monovalent hydrocarbon group selected from the group consisting of alkyl, aryl and aralkyl having 1 to 10 carbon atoms or a hydrogen atom, and a represents 0, 1 to 2), and said fluororesin is a fluororesin containing a hydroxyl group.

Preferably, the organic material particles consist of an acrylic resin, a fluororesin, a polyethylene wax or a mixture of at least two of these.

Preferably, the inorganic particles consists of silica.

Preferably, the inorganic material binder is formed of silica or alkyl silicate.

Alkyl silicate may contain of ethyl silicate, butyl silicate, a mixture thereof.

Further, the inorganic material binder may be complexed with an organic material.

Preferably, a catalyst may be added to the binder.

Further, the catalyst may contain an organic tin compound.

Preferably, the diameter of the particles is 1 to 10 μm, and the mixing ratio between the binder and the particles is such that the weight of the particles is 1 to 10 when the weight of the binder is 100.

Further, preferably, a film formed of a surfactant is provided interposed between the transparent insulating substrate and the anti-glare film.

The anti-glare film may preferably has a rough surface.

A surface protection film formed on the anti-glare film may further be provided.

According to another aspect of the present invention, a solar battery module is provided. The solar battery module includes a transparent electrode, a semiconductor photoelectric conversion layer and a back electrode layer formed in order on a first main surface of a transparent insulating substrate having first and second main surfaces, and an anti-glare film formed on the second main surface of the transparent insulating substrate, the anti-glare film contains an organic polymer, an inorganic polymer or a composite material thereof, and has a surface having fine roughness suitable for scattering light.

Preferably, an acrylic resin, a fluororesin or a mixed material of these may be used as the organic polymer contained in the anti-glare film.

For example, the acrylic resin contained in the anti-glare film includes an acryl copolymer containing a hydrolyzable silyl, containing a group represented by the following molecule structure:

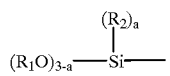

(in the formula, $R_1$ represents an alkyl having 1 to 10 carbon atoms, $R_2$ represents a monovalent hydrocarbon group selected from the group consisting of alkyl, aryl and aralkyl having 1 to 10 carbon atoms or a hydrogen atom, and a represents 0, 1 to 2), and said fluororesin is a fluororesin containing a hydroxyl group.

Preferably, a catalyst may be added to the anti-glare film.

Further, preferably, the catalyst contains an organic tin compound.

Preferably, alkyl silicate may be used as a raw material of the inorganic polymer contained in the anti-glare film.

Preferably, ethyl silicate, butyl silicate or a mixed material of these may be contained as the alkyl silicate.

Preferably, the anti-glare film contains silica obtained from an inorganic polymer.

More preferably, a surfactant may be interposed between the second main surface of the transparent insulating substrate and the anti-glare film.

More preferably, a dirt preventing film formed on the rough surface of the anti-glare film is further provided, the dirt preventing film having a flat surface.

According to a still further aspect of the present invention, a solar battery module is provided. The solar battery module includes a transparent electrode layer, a semiconductor photoelectric conversion layer and a back electrode layer formed in order on a first main surface of a transparent insulating substrate having first and second main surfaces, the second main surface of the transparent insulating substrate is covered by an anti-glare film having a rough surface texture having fine roughness suitable for scattering light, or the second main surface itself is processed to have a rough surface texture, the rough surface texture being covered by a surface film approximately maintaining the roughness, and the surface film includes an organic polymer, an inorganic polymer or a composite material thereof.

Preferably, the organic polymer included in the surface film may be an acrylic resin, a fluororesin or a mixed material thereof.

For example, the acrylic resin of the surface film includes an acryl copolymer containing a hydrolyzable silyl, containing a group represented by the following molecule structure:

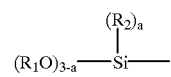

(in the formula, $R_1$ represents an alkyl having 1 to 10 carbon atoms, $R_2$ represents a monovalent hydrocarbon group selected from the group consisting of alkyl, aryl and aralkyl having 1 to 10 carbon atoms or a hydrogen atom, and a represents 0, 1 to 2), and the fluororesin is a fluororesin containing a hydroxyl group.

Preferably, alkyl silicate may be used as a raw material of the inorganic polymer contained in the surface film.

Preferably, ethyl silicate, butyl silicate or a mixed material thereof may be included as the alkyl silicate.

Preferably, the inorganic polymer contained in the surface film includes silica.

According to a still further aspect of the present invention, a solar battery module is provided. The solar battery module includes a transparent substrate, a semiconductor photoelectric conversion layer, a filler resin and back cover, a light entering surface of the transparent substrate is covered by an anti-glare film scattering light, or the light entering surfaces itself is processed to have a rough surface texture, and 60° glare of the light receiving surface of the solar battery module having the rough surface texture or the anti-glare film is at most 60.

Preferably, 60° gloss of the light receiving surface of the solar battery module having the rough surface texture or the anti-glare film is at most 45.

More preferably, 20° gloss of the light receiving surface of the solar battery module having the rough surface texture or the anti-glare film is at most 20 and, more preferably, at most 10.

According to a still further aspect of the present invention, a method of manufacturing a solar battery module is provided.

The method of manufacturing a solar battery module includes the steps of forming a first electrode layer on a first surface of a transparent insulating substrate having first and second surfaces, forming a photosemiconductor layer on the thus formed first electrode layer, forming a second electrode layer on the thus formed photosemiconductor layer, and forming an anti-glare film containing a binder and particles on the second surface, to which light enters, of the transparent insulating substrate, and the anti-glare film is formed after the first electrode layer, the photosemiconductor layer and the second electrode layer are formed on the first surface of the transparent insulating substrate.

The anti-glare film includes an organic material binder and organic material particles, an organic material binder and inorganic material particles, an inorganic material binder and organic particles, or an inorganic material binder and inorganic material particles.

Preferably, a catalyst may be added to the binder.

More preferably, the catalyst contains an organic tin compound.

According to a still further aspect of the present invention, a solar battery module is provided.

The solar battery module includes a transparent insulating substrate having first and second surfaces, a first electrode layer formed on the first surface of the transparent insulating substrate, a photosemiconductor layer formed on the first electrode layer, a second electrode layer formed on the photosemiconductor layer, and an anti-glare film formed on the second surface, to which light enters, of the transparent insulating substrate, and arithmetic mean roughness Ra of the anti-glare film is within the range of 0.1 to 10 μm.

The anti-glare film contain an organic material binder and organic material particles, an organic material binder and inorganic material particles, an inorganic material binder and organic material particles, or an inorganic material binder and inorganic material particles.

Preferably, a catalyst may be added to the anti-glare film.

Preferably, the catalyst may contain an organic tin compound.

As the solar battery module in accordance with the present invention includes an anti-glare film provided on the light entering surface of the transparent insulating substrate, the problem of public nuisance caused by light reflection can effectively be prevented.

By the method of manufacturing a solar battery module, the anti-glare film is formed after the element portion is formed on the surface of the transparent insulating substrate. Therefore, without the necessity of using an expensive figured glass or the like as the substrate, the appearance of the solar battery module can be improved to prevent reflection or public nuisance caused by light. Further, as the anti-glare film is formed last, the basic steps of manufacturing the solar battery module are kept unchanged, while the appearance can be improved.

When a binder resin and the particles of the anti-glare film are both organic materials, for example, good adhesion is attained, so that dropping of particles or separation of the film itself can be suppressed, and hence superior solar battery module is obtained.

When the anti-glare film includes organic material binder and organic material particles, the amount of incident light is not so reduced as to affect practical use, and sunshine can be utilized effectively. Further, the inorganic particles do not much suffer from the problem of deterioration, and hence a solar battery module having superior weather resistance can be obtained.

When the anti-glare film incorporates an inorganic material binder and organic material particles, the amount of incident light is not reduced and the sunshine can be utilized effectively. In addition, the organic material particles relax strain in the binder layer, suppressing generation of cracks, and therefore a solar battery module having superior weather resistance is obtained.

When the anti-glare film incorporates an inorganic material binder and inorganic material particles, the amount of incident light is not so reduced as to affect practical use, so that sunshine can be effectively utilized, and as both materials are inorganic, good adhesion is attained. Further, as the inorganic material binder and the inorganic material particles do not much suffer from the problem of deterioration, a solar battery module having superior weather resistance can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
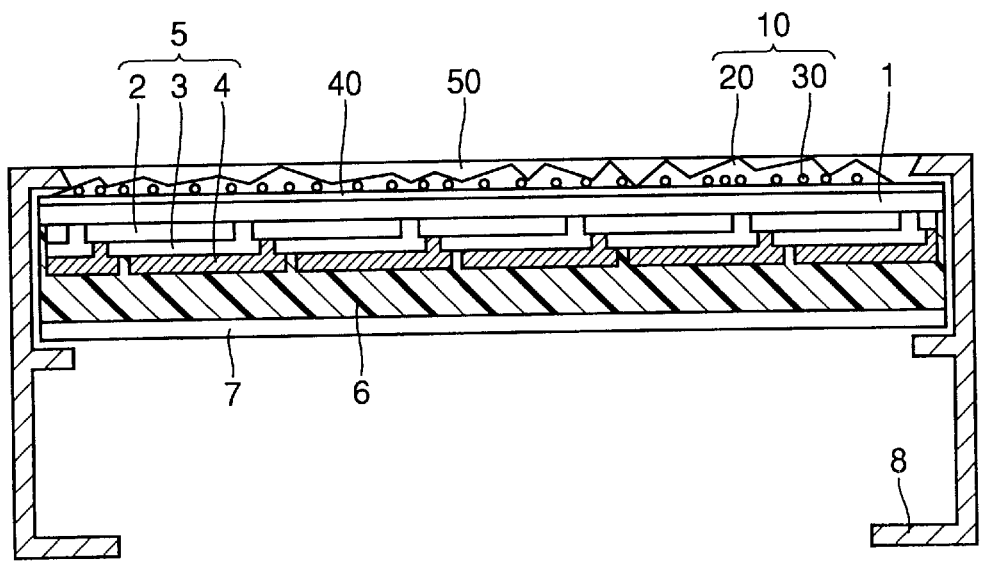
FIG. 1 is a cross section representing a schematic structure of an example of the solar battery module in accordance with the present invention.

FIG. 1 is a cross section representing a schematic structure of the solar battery module in accordance with a first embodiment of the present invention. In the figures of the present application, the dimensional relation is appropriately changed for simplicity and clarification of the drawings, and not reflecting the actual dimensional relation. Particularly, fine unevenness on the anti-glare film surface is emphasized.

Referring to FIG. 1, the solar battery module includes a transparent insulating substrate 1, a transparent electrode layer 2 formed on a surface different from a light entering surface of transparent insulating substrate 1, a photo semiconductor layer 3 formed on transparent electrode layer 2, and a back electrode layer 4 formed on photo semiconductor layer 3. A photo semiconductor element 5 formed by successive deposition of transparent electrode layer 2, photo semiconductor layer 3 and back electrode layer 4 is divided into a plurality of areas, and the areas are electrically connected in series or in parallel with each other.

The solar battery module is sealed and protected by a filler resin 6 and a back cover film 7 to protect photo semiconductor element 5. Further, the solar batteriesealed in this manner has a frame 8 attached thereto, for holding transparent insulating substrate 1, filler resin 6, back cover film 7 and the like and for the attachment on a base on a roof or the like. Provision of the frame is not a limitation of the present invention. The module without the frame, the module embedded in a roof tile and the like are also covered by the present invention.

Further, on the light entering surface of transparent insulating substrate 1, an anti-glare film 10, which is the characteristic of the present invention, is formed with a film 40 formed of a surfactant interposed. Anti-glare film 10 has its surface made rough. A surface protection film 50 having a flat surface is further formed on the roughened surface of anti-glare film 10.

Anti-glare film 10 may be one irregularly refracting light incident from the side of the light entering surface, or one which improves transmittance of the incident light to reduce reflection. More specifically, a film containing an organic material binder and organic material particles, a film containing an organic material binder and inorganic material particles, film containing an inorganic material binder and organic material particles, a film containing an inorganic binder and inorganic material particles and so on may be used as anti-glare film 10.

As to the properties of the resin which may be used as the organic material binder contained in anti-glare film 10, a material which has sufficient wear resistance and good light transmittance and forms a film at a temperature not degrading the solar battery element in the process of film deposition, specifically at a temperature not higher 200° C. and more preferably not higher than 150° C. is preferably used.

An acrylic resin, a fluororesin or mixed resin thereof, or a binder containing such a resin or mixed resin may be used as the organic binder in accordance with the present invention.

Though not limiting as long as the above described properties are satisfied, the acrylic resin, the fluororesin or mixed resin thereof should be contained by at least 50 wt %, preferably at least 80 wt % and most preferably, at least 95 wt % in the binder resin.

A resin obtained by polymerizing or co-polymerizing a monomer mainly consisting of acrylic monomer is prepared as the acrylic resin. A resin obtained by polymerization using fluorine containing monomer is preferable as the fluororesin.

As the acrylic resin, further, a resin having a hydrolyzable silyl is preferred. More specifically, a vinyl resin having a silyl of which main chain is substantially formed of polyvinyl type and has at least one silicon atom bonded with a hydrolyzable group at an end or a side chain per molecule is preferred. Alternatively, the vinyl resin having a silyl may be obtained by co-polymerization of a vinyl monomer and a monomer having hydrolyzable silyl and partially containing an urethane bond or siloxane bond in the main chain or the side chain.

Vinyl monomer is not specifically limited, and may include: methyl(meth)acrylate, ethyl(meth)acrylate, butyl (meth)acrylate, 2-ethylhexyl(meth)acrylate, stearyl(meth) acrylate, benzyl(meth)acrylate, cyclohexyl(meth)acrylate, trifluoroethyl(meth)acrylate, pentafluoropropyl(meth) acrylate, unsaturated carbonic acid ester such as a diester or a half ester of polycarboxylic acid (maleic acid, fumaric acid, itaconic acid or the like) with straight or branched chain alcohol having 1 to 20 carbon atoms; aromatic hydrocarbon vinyl compound such as styrene, a-methylstyrene, chlorostyrene, styrenesulfonic acid, 4-hydroxystyrene and vinyltoluene; vinyl ester or allyl compound such as vinylacetate, vinylpropionate, and diallylphthalate; vinyl compound having nitrile group such as (meth)acrylonitrile; vinyl compound having epoxy group such as glycidyl(meth) acrylate; vinyl compound having amino group such as dimethylaminoethyl(meth)acrylate, diethylaminoethyl (meth)acrylate, vinylpyridine, and aminoethylvinylether; vinyl compound having amide group such as (meth) acrylamide, diamideitaconate, a-ethyl(meth)acrylamide, crotonamide, diamidemaleate, diamidefumarate, N-vinylpyrrolidone, N-butoxymethyl(meth)acrylamide, N,N-dimethylacrylamide, N-methylacrylamide, and acryloylmorpholine; vinyl compound having hydroxyl group such as 2-hydroxyethyl(meth)acrylate, 2-hydroxypropyl (meth)acrylate, 2-hydroxyethylvinylether, N-methylol (meth)acrylamide, Aronix 5700 (Toagosei Chemical Industry Co. Ltd.), Placcel FA-1, Placcel FA-4, Placcel FM-1, Placcel FM-4 (Daicel Chemical Industries, Ltd.); unsaturated carbonic acid, acid anhydride or salt thereof such as (meth)acrylate, maleic acid, fumaric acid, itaconic acid and salt thereof (an alkali metal salt, an ammonium salt, an amine salt) and maleic acid dehydrides; and other vinyl compound such as vinylmethylether, vinylchloride, vinylidenechloride, chloroprene, propylene, butadiene, isoprene, maleimide, N-vinyl imidazole, and vinyl sulfonic acid.

Specific example of alkoxysilane vinyl monomer is as follows:

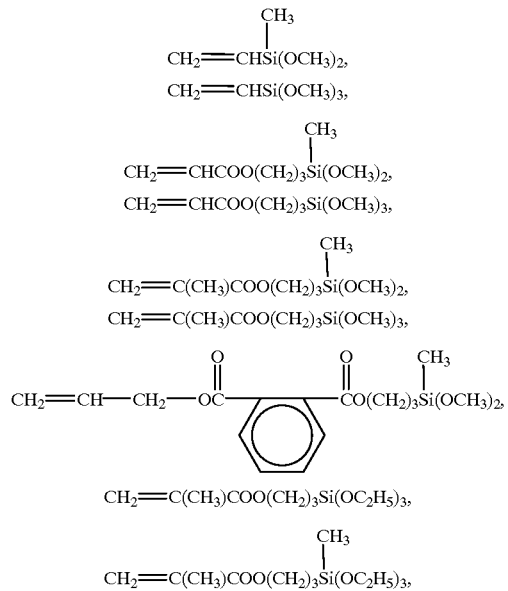

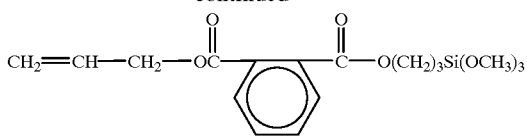

These alkoxy silane vinyl monomer units are contained preferably by 5 to 90 wt %, and more preferably, 20 to 80 wt %, and most preferably, 30 to 70 wt %.

As to the process of producing copolymer of alkoxysilane vinyl monomer and vinyl monomer, the process described in Japanese Patent Laying-Open No. 54-36395, 57-36109, 58-157810 or the like may be used. Solution polymerization using an azo-based free radical initiator such as azobisisobutyronitrile is most preferred. If necessary, molecular weight may be adjusted by using chain transfer agent such as n-dodecylmercaptan, t-dodecylmercaptan, n-butylmercaptan, γ-mercaptopropyltrimethoxysilane, γ-mercaptopropyltriethoxysilane, γ-mercaptopropylmethyldimethoxysilane, γ-mercaptopropylmethyldiethoxysilane, $(H_3CO)_3Si—S—S—Si(OCH_3)_3$, or $(CH_3O)_3Si—S_8—Si(OCH_3)_3$. Particularly, by using a chain transfer agent having a hydrolyzable silyl in the molecule, for example γ-mercaptopropyltrimethoxysilane, it is possible to introduce a hydrolyzable silyl at the end of vinyl copolymer having silyl. A non-reactive polimerization solvent such as hydrocarbon (toluene, xylene, n-hexane, cyclohexan or the like), acetic acid ester (ethylacetate, xutylacetate or the like), alcohol (methanol, ethanol, isopropanol, n-butanol or the like), ether (ethylbatteryosolve, butylbatteryosolve, batteryosolveacetate or the like), ketone (methylethylketone, ethylacetoacetate, acetylacetone, diacetonealcohol, methylisobutylketone, acetone or the like) may be used without problem.

Further, it is preferred that the fluororesin has a hydroxyl group. A fluorine copolymer having hydroxyl group is obtained by co-polymerization of (1), (2) and (3) as listed below, having hydroxy value of 5 to 300 mg KOH/g, and preferably 10 to 250 mg KOH/g: (1) fluoroolefin such as chlorotrifluoroethylene, tetrafluoroethylene and trifluoroethylene; vinyl monomer having fluorine such as fluoroalkyl (meth)acrylate including $CH_2=CHCOOCH_2CF_3$, $CH_2=C(CH_3)COOCH_2CF_3$, $CH_2=CHCOOCH(CF_3)_2$, $CH_3=C(CH_3)COOCH(CF_3)_2$, $CH_2=CHCOOCH_2CF_2CH_2CF_3$, $CH_2=CHCOOCF_3$, $CH_2=C(CH_3)COOCH_2CF_2CF_2CF_3$, and $CH_2=C(CH_3)COOCF_3$; (2) hydroxyalkylvinylether such as hydroxyethylvinylether, hydroxypropylvinylether, hydroxybutylvinylether, hydroxyhexylvinylether; vinyl monomer having hydroxyl group such as 2-hydroxyethylacrylate, 2-hydroxyethylmethacrylate, 2-hydroxypropylacrylate, 2-hydroxypropylmethacrylate, N-methylolacrylamide, N-methylolmethacrylamide, Aronix 5700 (Toa gosei Chemical Industries, Ltd.), Placcel FA-1, Placcel FA-4, Placcel FM-1, and Placcel FM-4 (Daicel Chemical Industries, Ltd.); (3) alkylvinylether such as ethylbinylether, propylvinylether, and butylvinylether; cyclohexylvinylether; monomer having carboxyl group such as maleic acid, fumaric acid, acrylic acid, methacrylic acid and carboxylalkylvinylether; ethylene, propylene, vinylchloride, vinylidenechloride, vinylacetate; and monomer having hydrolyzable silyl such as vinyltriethoxysilane, and γ-(meth)acryloyloxypropyltrimethoxysilane.

An example of the resin having hydrolyzable silyl is GEMLAC (registered trademark) manufactured by KANEKA CORPORATION, and examples of the fluororesin or resin compound having a hydroxyl group include LUMIFLON and BONFLON manufactured by Asahi Glass Company Limited, NewGamet manufactured by Toube and VFLON of Dainippon Toryo Company Limited (all registered trademarks).

Basic physical properties of LUMIFLON are as follows.

TABLE 1

Basic Physical Properties of LUMIFLON

| Type Property | LF100 | LF200 | LF302 | LF400 | LF554 | LF600 |
|---|---|---|---|---|---|---|
| Concentration of Non-volatile Part (wt %) | 50 | 60 | 50 | 50 | 40 | 50 |
| Specific Gravity (–) | 1.08 | 1.12 | 1.07 | 1.07 | 1.03 | 1.03 |
| OH Value (mgKOH/g) | 26 | 32 | 24 | 24 | 21 | 31 |
| Acid Value (mgKOH/g) | 0 | 0 | 0 | 2.5 | 2 | 0 |
| Solvent | Xylene | Xylene | Xylene | Xylene | SOLVESSO 150/ Cyclohexanone = 8/2 | Xylene/ Toluene = 1/1 |
| Feature | High Viscosity | Low Viscosity | Cut UV Ray | Contain Acid Value | Post Processability | Extensibility |

GEMLAC has the following molecule structure.

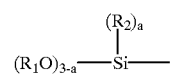

(In the formula, $R_1$ represents an alkyl having 1 to 10 carbon atoms, $R_2$ represents a monovalent hydrocarbon group selected from the group consisting of alkyl, aryl and aralkyl having 1 to 10 carbon atoms or a hydrogen atom, and a represents 0, 1 or 2.

As the inorganic binder of anti-glare film 10, a silicon containing compound and/or partially hydrolyzed condensate thereof, which is represented by the following general formula, may be used:

$$(R_3O)_{4-b}—Si—(R_4O)_b$$

(in the formula, $R_3$ represents a monovalent hydrocarbon group selected from alkyl, aryl and aralkyl having 1 to 10 carbon atoms, $R_4$ represents a monovalent hydrocarbon group selected from alkyl, aryl and aralkyl having 1 to 10 carbon atoms, and b represents 0 or 1).

In the general formula above, $R_3$ represents a monovalent hydrocarbon group selected from alkyl having 1 to 10 carbon atoms, preferably alkyl having 1 to 4 carbon atoms, aryl, preferably aryl having 6 to 9 carbon atoms and aralkyl, preferably aralkyl having 7 to 9 carbon atoms. $R_4$ represents a monovalent hydrocarbon group selected from alkyl having 1 to 10 carbon atoms, preferably alkyl having 1 to 4 carbon atoms, aryl, preferably aryl having 6 to 9 carbon atoms and aralkyl, preferably aralkyl having 7 to 9 carbon atoms. Further, b represents 0 or 1, and therefore, in one molecule, there are three to four ($R_3O$) groups. The three to four ($R_3O$) groups existing in one molecule may or may not be the same.

Examples of the alkyl having 1 to 10 carbon atoms, preferably alkyl having 1 to 4 carbon atoms, aryl having 6 to 9 carbon atoms and aralkyl having 7 to 9 carbon atoms may include methyl group, ethyl group, n-propyl group, i-propyl group, n-buthyl group, i-buthyl group, t-buthyl group, phenyl group and benzyl group.

Specific examples of the silicon containing compound are as follows: tetraalkyl silicate such as tetramethylsilicate, tetraethylsilicate, tetra-n-propylsilicate, tetra-i-propylsilicate, tetra-n-butylsilicate, tetra-i-butylsilicate and tetra-t-butylsilicate; trialkoxysilane or triaryloxysilane such as alkyltrialkoxysilane such as methyltrimethoxysilane, methyltriethoxysilane, octadecyltriethoxysilane, methyltri-isopropoxysilane and methyltributoxysilane, aryl trialkoxysilane such as phenyltrimethoxysilae and phenyltriethoxysilane, alkyltriaryloxysilane such as methyltriphenoxysilane, and glycidoxytrialkoxysilane such as 3-glycidoxy propyltrimethoxysilane.

The partially hydrolyzed condensate of the silicon containing compound may be prepared by adding water to tetraalkylsilicate, trialkoxysilane, triaryloxysilane or the like in a usual manner, causing partial hydrolysis and condensing the resulting substance. Specific examples are tetraalkylsilicate partially hydrolyzed condensate such as MSI51, ESI40, HAS-1 and HAS-10 (manufactured by CORUCOAT), trialkoxysilane partially hydrolyzed condensate such as AFP-1 (manufactured by SHIN-ETU KAGAKU KOGYO), TSB4200, TSB4300, TSB4400 and BELCLEAN.

MSI51 mentioned above is a partially hydrolyzed condensate represented by the following formula:

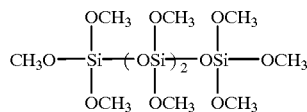

ESI40 mentioned above is a partially hydrolyzed condensate represented by the following formula:

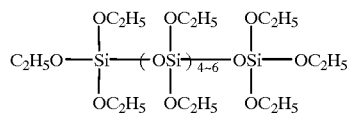

Single inorganic binder or two or more binders mixed or a material mainly consisting of these or mixture thereof may be used. The inorganic material binder having organic molecules added in the molecular structure of the inorganic material binder, an inorganic material binder having inorganic molecules and organic molecules mixed, or an inorganic material binder in which organic material binder is dispersed, may be used.

It is possible and preferable to control film formation rate by adding a catalyst to the inorganic material binder, as in the case of GEMLAC. Specific examples of the curing catalyst are as follows: organic tin compound such as dibutyltindilaurate, dibutyltindimalate, dioctyltindimalate and tinoctylate; phosphoric acid or phosphoric acid ester such as phosphoric acid, monomethylphosphate, monoethylphosphate, monobutylphosphate, monooctylphosphate, monodecylphosphate, dimethylphosphate, diethylphosphate, dibutylphosphate, dioctylphosphate and didecylphosphate; addition reaction product of epoxy compound and phosphoric acid and/or monoacidic phosphoric ester such as propyleneoxide, butyleneoxide, cyclohexeneoxide, glycidylmethacrylate, glycidol, acrylglycidylether, γ-glycidoxypropyltrimethoxysilane, γ-glycidoxypropyltriethoxysilane, γ-glycidoxypropylmethyldimethoxysilane,

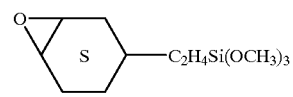

KADULA E (manufactured by YUKA SHELL), EPICOAT 828 (manufactured by YUKA SHELL) and EPICOAT 1001 (manufactured by YUKA SHELL); organic titanate compound; organic aluminum compound; acidic compound such as maleic acid and paratoluenesulfonic acid; aliphatic diamines such as ethylenediamine and hexanediamine; aliphatic polyamines such as diethylenetriamine, triethylenetetraamine and tetraethylenepentaamine; alicyclic amines such as piperidine and piperazine; aromatic amines such as methaphenylenediamine, ethanol amines, triethylamine, γ-aminopropyltriethoxysilane, N-β-(aminoethyl)-γ-aminopropyltrimethoxysilane; amines such as hexylamine, di-2-ethylhexylamine, N,N-dimethyldodecylamine and dodecylamine; reaction product of these amines and acidic phosphoric ester; alkaline compound such as sodium hydroxide and potassium hydroxide; alkylmercaptan such as n-dodecylmercaptan and tert-butylmercaptan; mercaptosilane such as r-mercaptopropyltrimethoxysilane; carboxylic acid such as 2-mercaptopropionic acid and thiosalicylic acid; ester compound such as thioglycolic acid-2-ethylhexyl; polymer such as CAPCURE3-800 (manufactured by Diamond Shamlock Chemicals, polyether having mercapto group at both ends); and compound having mercapto group such as thiophenol and thiobenzoic acid. Among these curing catalysts, organic tin compound, acidic phosphoric acid, amines, reaction product of acidic phosphoric acid ester and amine, saturated or unsaturated multivalent carboxylic acid or acid anhydride thereof, reactive silicon compound, organic titanate compound, organic aluminum compound or mixture thereof are preferable. Organic tin compound or curing catalyst containing organic tin compound is more preferable, and particularly, a curing catalyst containing organic tin compound and at least one of amine and mercapto compound is most preferable.

As to the properties of the resin and the like which may be used as the inorganic material binder, a material which has sufficient weather resistance and good light transmittance and forms a film at a temperature not degrading the solar battery element in the process of film formation, more specifically, at a temperature not higher than 200° C. and more preferably not higher than 150° C. is preferably used.

More specifically, commercially available TSB4200, TSB4300, TSB4400 or BELCLEAN (registered trademark)

having an organic material binder mixed therein, for example, may be preferably used as the material of the inorganic material binder.

"TSB4200", TSB4300" and "TSB4400" are inorganic varnish manufactured by T.S.B Company. "TSB4200" mainly consists of ethyl silicate and "TSB4400" mainly consists of butyl silicate. "TSB4300" is a mixture of ethyl silicate an butyl silicate. These all function as a heat resistant insulating material having weather resistance.

"BELCLEAN" is a ceramic based paint manufactured by Nippon Yushi Kabushiki Kaisha, in which special ceramic component is complexed with highly durable organic component.

An acrylic resin, a fluororesin, polyethylene wax or a mixture of at least two of these, or a material mainly consisting of such resin or mixed resin may be used as the organic material particles of anti-glare film 10. More specifically, MBX-8 manufactured by Sekisui Kasei containing PMMA (polymethyl methacrylate) having $\phi 8$ $\mu$m, SE480-10T manufactured by Kusomoto Kasei containing PE polyethylene) having average diameter of $\phi 15$ $\mu$m and maximum diameter of $\phi 30$ $\mu$m or the like may be used.

As to the inorganic material particles of anti-glare film 10, particles formed of silica may be used. More specifically, TS100 manufactured by Degusa Japan containing silica of $\phi 4$ $\mu$m, OK-607 manufactured by Degusa Japan containing silica of $\phi 2$ $\mu$m, EG-ST-ZL manufactured by Nissan Kagaku Kogyo Kabushiki Kaisha containing silica sol of $\phi 0.7$ to $0.1$ $\mu$m, for example, may be used.

The diameter of the organic material or inorganic material particles should be 0.05 to 200 $\mu$m, preferably, 0.5 to 100 $\mu$m and, more preferably, 1 to 10 $\mu$m. With the diameter of particles within this range, reflection can be suppressed.

As to the weight ratio of mixture of the organic material or inorganic material binder and the organic material or inorganic material particles, when the weight of the organic material or inorganic material binder is assumed to be 100, the weight of the organic material or inorganic material particles should be 50 to 2000 and more preferably 100 to 1500, if the diameter of the inorganic material or inorganic material particles is smaller than 1 $\mu$m.

When the diameter of the organic material or inorganic material particles is not smaller than 1 $\mu$m and, preferably, when the diameter is 1 to 10 $\mu$m, the weight ratio of mixture of the organic material or inorganic material binder and the organic material or inorganic material particles should be as follows. The weight of the organic or inorganic material particles is 0.1 to 98, preferably 1 to 50 and more preferably 1 to 10, when the weight of the organic material or inorganic material binder is assumed to be 100. When the diameter of the particles is small, the anti-glaring effect of the present invention cannot sufficiently be attained, and when the diameter of particles is large, dispersing property with respect to the binder resin is undesirably degraded.

Preferably, the anti-glare film 10 has a thickness of 0.1 to 500 $\mu$m, preferably, 0.5 to 100 $\mu$m and more preferably, 1 to 30 $\mu$m.

Figure 2:
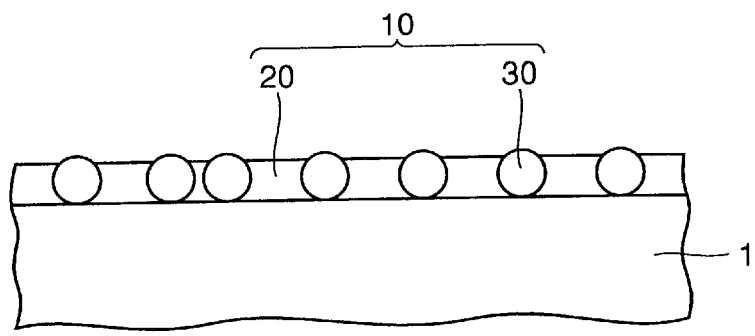
FIG. 2 is a cross section showing, partially in enlargement, the portion of the anti-glare film of an example of the solar battery module in accordance with the present invention.

FIG. 2 is a cross section showing, partially in enlargement, a portion of anti-glare film 10 in accordance with an example of the solar battery module of the present invention.

Though not shown, the anti-glare film may be a single layer, or a plurality of anti-glare films having different materials, different shapes and different thicknesses may be overlapped to possibly improve anti-glaring effect and transmittance.

In the anti-glare film 10 of the solar battery module, a single layer of organic or inorganic material particles 30 is positioned in an organic or inorganic material binder 20, as can be seen from FIG. 2. This structure prevents lowering of transmittance.

Figure 3:
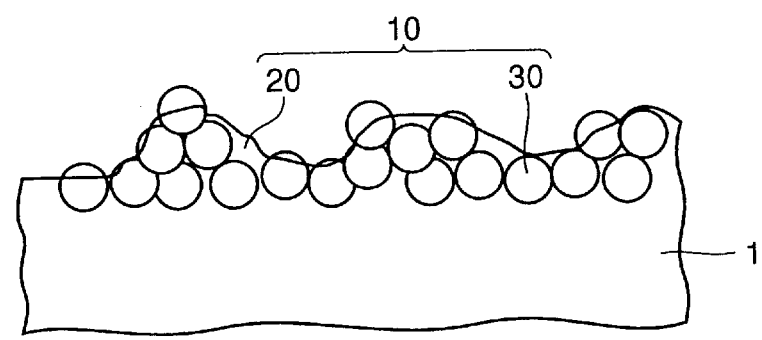
FIG. 3 is a cross section showing, partially in enlargement, the portion of the anti-glare film of another example of the solar battery module in accordance with the present invention.

FIG. 3 is a cross section showing, partially in enlargement, a portion of anti-glare film 10 in accordance with another example of the solar battery module of the present invention.

As can be seen from FIG. 3, in anti-glare film 10 of the solar battery module, the organic or inorganic material particles 30 are arranged in a plurality of layers in the organic or inorganic material binder 20. This structure improves anti-glaring effect.

In this manner, the organic or inorganic material particles may be formed in a single layer or a plurality of layers on the entire surface of the anti-glare film, or the particles may be formed partially in single layer and partially in a plurality of layers.

As the anti-glare film is formed on the light entering surface of the transparent insulating substrate, most of the sunlight entering the solar battery module contributes to electricity generation. About 2 to 4% of the light reflected from the surface is reflected in unspecified directions. The sunlight irregularly reflected and scattered is not parallel light beams. Therefore, the light reflected from the solar battery module is blurred as a whole, and therefore, the solar battery is not glaring even when viewed directly.

In the solar battery module in accordance with the present embodiment, ITO, $SnO_2$, a stacked body of these, that is, ITO/$SnO_2$, ZnO or the like, that is, a material which transmits light, is used as transparent electrode layer 2.

As photo semiconductor layer 3, a semiconductor layer in which amorphous or microcrystal of amorphous silicon based semiconductor such as amorphous silicon a-Si, amorphous silicon hydride a-Si:H, amorphous silicon carbide hydride a-SiC:H, amorphous silicon nitride or the like, or an alloy of silicon and carbide, germanium, tin or other element synthesized to pin type, nip type, ni type, pn type, MIS type, heterojunction type, homojunction type, shot key barrier type or combination thereof may be used. Other than those described above, a CdS based, GaAs based, InP based photo semiconductor layer and the like may be used, without any limitation.

A metal, or a composite film of metal and metal oxide may be used as back electrode layer 4.

As filler resin 6, silicone, ethylenevinylacetate, polyvinylbutyral and the like may be used. A fluororesin film, polyethyleneterephtalate, a metal film such as aluminum, a multilayered film formed by laminating thin films of $SiO_2$ or the like may be used as back cover film 7.

Though a thin film based solar battery module is described in the present embodiment, the present invention is also applicable to a crystal based solar battery module.

The method of manufacturing the solar battery module of the first embodiment shown in FIG. 1 will be described in the following.

First, on a surface different from the light entering surface of transparent insulating substrate 1, transparent electrode layer 2, photo semiconductor layer 3 and back electrode layer 4 are formed successively. These layers are divided into a plurality of areas by patterning means such as a laser scribe. For example, transparent electrode layer 2 is formed to a prescribed pattern by laser processing, etching, lift-off or the like. Back electrode layer 4 is formed by vapor deposition, sputtering or the like and thereafter, formed to a prescribed pattern by laser processing, etching, lift-off or the like in the similar manner.

After photo semiconductor element 5 consisting of transparent electrode layer 2, photo semiconductor layer 3 and back electrode layer 4 is formed on transparent insulating substrate 1, the element is sealed and fixed by filler resin 6 and, further back cover film 7 is attached for protection.

Thereafter, on the light entering surface side of transparent insulating substrate 1 on which photo semiconductor element 5 is formed, anti-glare film 10, which is the feature of the present invention, is formed. The anti-glare film may be formed at any time after the second electrode layer is formed and scribed. Namely, the anti-glare film may be formed immediately after the scribe, after the back surface is sealed, after a terminal box is attached, or even after installation on a roof, and the timing is not specifically limited, though dependent on the method of applying films.

Here, it is preferred that a film 40 of surfactant is interposed between transparent insulating substrate 1 and anti-glare film 10. Such a film 40 interposed improves adhesion strength between transparent insulating substrate 1 and anti-glare film 10, and reduces local unevenness of application.

In the present embodiment, anti-glare film 10 is formed after the formation of photo semiconductor element 5. This is because if photo semiconductor element 5 is formed after anti-glare film 10, laser beam cannot be sharply focused when photo semiconductor element 5 is to be formed, or it becomes impossible to use a vacuum chamber to form photo semiconductor element 5.

Figure 4:
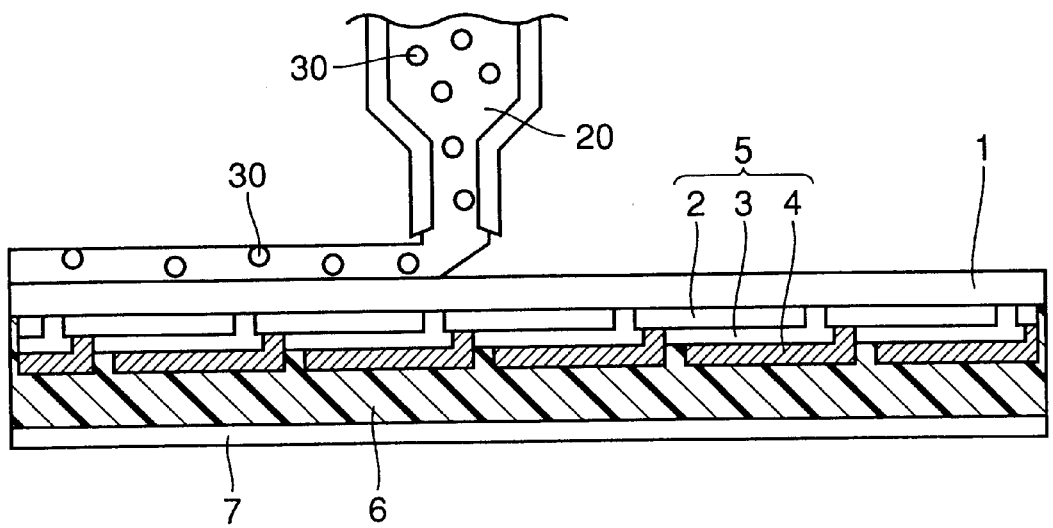
FIG. 4 is a cross section representing an example of the method of manufacturing the solar battery module in accordance with the present invention.
Figure 5:
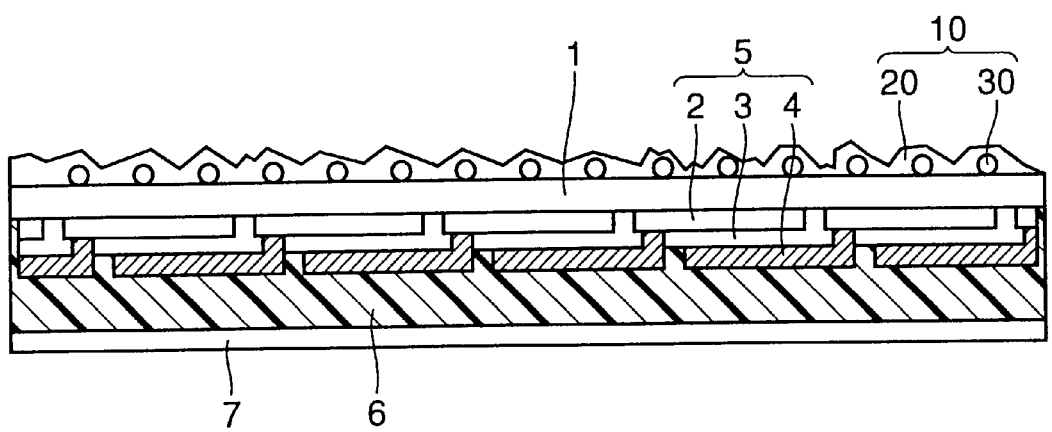
FIG. 5 is a cross section representing an example of the method of manufacturing the solar battery module in accordance with the present invention.

FIGS. 4 and 5 are cross sections representing an example of the method of manufacturing a solar battery module in accordance with the present invention, showing an example of a method of forming anti-glare film 10.

First, referring to FIG. 4, on the light entering surface of transparent insulating substrate 1 of the sealed solar battery module, an organic or inorganic material binder 20 having organic or inorganic material particles 30 mixed is applied.

At this time, when particles 30 are of large size, the surface of anti-glare film 10 is made rough by the distribution of particles 30, when the film of binder resin 20 is formed, as shown in FIG. 5.

Figure 6:
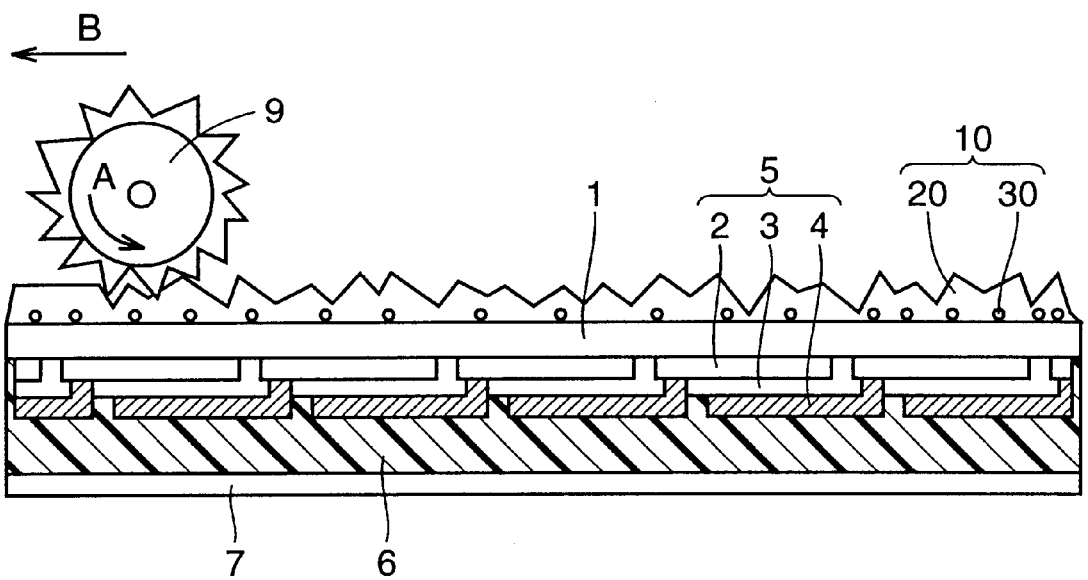
FIG. 6 is a cross section representing another example of the method of manufacturing the solar battery module in accordance with the present invention.

FIG. 6 is a cross section representing another example of the method of manufacturing the solar battery module in accordance with the present invention, showing another example of the method of forming anti-glare film 10.

Referring to FIG. 6, after the organic or inorganic material binder resin 20 is applied, a roller 9 on which a cloth having a prescribed pattern shape is wound is moved in the direction of the arrow B while rotated in the direction of the arrow A so that the prescribed pattern is transferred, and the binder resin film 20 is formed. Thus, anti-glare film 10 comes to have roughened surface.

As to the method of making rough the light entering surface of anti-glare film 10, the method of utilizing mixed particles, the method of forming a film after embossing on the applied binder resin, as described above, or by adjusting nozzle shape when the binder resin is applied, for example.

In the embodiment shown in FIG. 1, a surface protection film 50 having flat surface is formed further on the roughened surface of anti-glare film 10. Provision of such surface protection film 50 effectively prevents lowering of photoelectric conversion efficiency, which is experienced when dirt is deposited on the surface.

Figure 7:
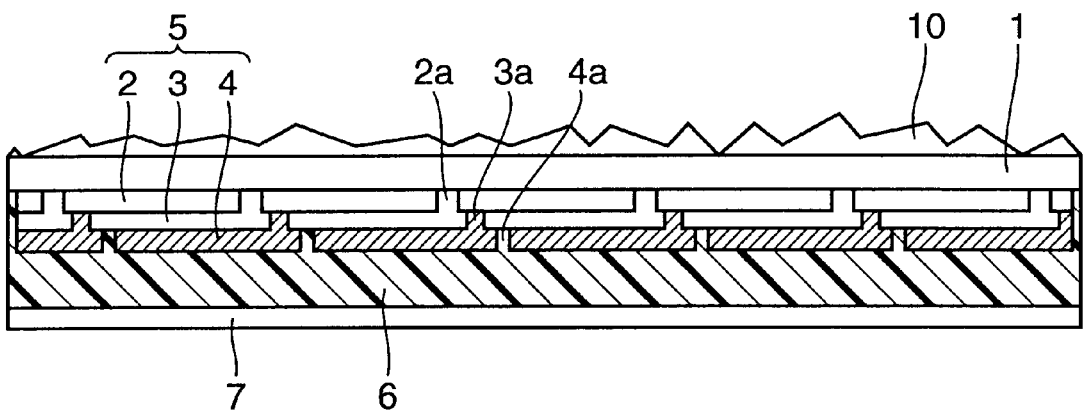
FIG. 7 is a schematic cross section representing a still another example of the solar battery module in accordance with the present invention.

FIG. 7 is a schematic cross section of a portion of the thin film based solar battery module, as another example of the present embodiment.

In the thin film solar battery module of FIG. 7, not a glass substrate having such a surface that has fine roughness as disclosed in Japanese Patent Laying-Open No. 11-74552 but a glass plate of which opposing surfaces are flat is used as transparent insulating substrate 1 which also serves as a cover glass.

On the lower surface of transparent insulating substrate 1, transparent electrode layer 2 formed of a known TCO such as $SnO_2$, an arbitrary known semiconductor thin film photoelectric conversion layer 3 formed of silicon or the like, and a known back plate electrode layer 4 of Ag or the like are deposited in this order. The layers 2, 3 and 4 are divided into a plurality of thin strip-shaped areas by transparent electrode dividing slits 2a, semiconductor layer dividing slits 3a and back electrode dividing slits 4a, respectively, extending in the direction orthogonal to the sheet surface of FIG. 7. Of the plurality of areas, the strip-shaped transparent electrode layer 2, semiconductor photoelectric conversion layer 3 and back electrode layer 4 deposited overlapping with each other constitute one strip-shaped solar cell 5. Transparent electrode 2 of an arbitrary cell 5 is connected to back electrode layer 4 of the neighboring cell 5 on the left side through semiconductor layer dividing slit 3a. More specifically, the plurality of cells 5 are integrated to be electrically connected in series with each other The back surface of the plurality of cells integrated in this manner is sealed and protected by covering back electrode layer 4 with a known filler resin 6 and depositing a known weather resistant back cover film 7 thereon.

On the upper surface of transparent insulating substrate 1, a light transmitting anti-glare film 10 is formed. The upper surface of anti-glare film 10 is made rough with fine ups and downs, suitable for scattering light. An organic polymer, an inorganic polymer or composite material thereof may be used as the material of anti-glare film 10. A plurality of layers of such materials may be used. For example, it may be possible to improve anti-glaring effect by combining materials having different indexes of refraction, to provide inorganic polymer coating on a surface to improve hardness or wear resistance, to provide an organic polymer coating on the surface to absorb cracks on the surface, or to apply a fluororesin having high water repellancy or an inorganic polymer having good water dispersion properties to prevent dirt.

An acrylic resin, a fluororesin, a mixed resin thereof, or a material containing such resin or mixed resin, similar to those listed for the organic material binder used in the embodiment shown in FIG. 1, may be used as the organic polymer for the anti-glare film 10 of the present embodiment.

As to the properties of the polymer for anti-glare film 10, a material which has sufficient wear resistance and good light transmittance and hardens at a temperature not degrading the solar battery in the process of hardening, specifically at a temperature not higher than 200° C. and more preferably not higher than 150° C. is desirable.

As the row material of inorganic polymer contained in anti-glare film 10, alkyl silicate represented by general formula (II) and/or condensate thereof may be used. More specifically, alkyl silicate may include ethyl silicate, methyl silicate, butyl silicate or mixture thereof. Such an inorganic polymer may eventually be converted to silica. Further, the inorganic polymer may have organic molecules added to the molecular structure of the inorganic polymer, or inorganic molecules and organic molecules may be mixed. Alternatively, the inorganic polymer may have organic polymer dispersed therein. It is possible and preferable to control the rate of film formation until hardening by adding a catalyst before application, to the inorganic polymer. Specific examples of the curing catalyst are as follows: organic tin compound such as dibutyltindilaurate, dibutyltindimalate, dioctyltindimalate and tinoctylate; phosphoric acid or phosphoric acid ester such as phosphoric acid, monomethylphosphate, monoethylphosphate, monobutylphosphate, monooctylphosphate, monodecylphosphate, dimethylphosphate, diethylphosphate, dibutylphosphate, dioctylphosphate and didecylphosphate; addition reaction product of epoxy compound and phosphoric acid and/or monoacidic phosphoric ester such as propyleneoxide, butyleneoxide, cyclohexeneoxide, glycidylmethacrylate, glycidol, acrylglycidylether, γ-glycidoxypropyltrimethoxysilane, γ-glycidoxypropyltriethoxysilane, γ-glycidoxypropylmethyldimethoxysilane,

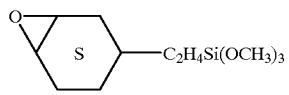

KADULA E (manufactured by YUKA SHELL), EPICOAT 828 (manufactured by YUKA SHELL) and EPICOAT 1001 (manufactured by YUKA SHELL); organic titanate compound; organic aluminum compound; acidic compound such as maleic acid and paratoluenesulfonic acid; aliphatic diamines such as ethylenediamine and hexanediamine; aliphatic polyamines such as diethylenetriamine, triethylenetetraamine and tetraethylenepentaamine; alicyclic amines such as piperidine and piperazine; aromatic amines such as methaphenylenediamine, ethanol amines, triethylamine, γ-aminopropyltriethoxysilane, N-β-(aminoethyl)-γ-aminopropyltrimethoxysilane; amines such as hexylamine, di-2-ethylhexylamine, N,N-dimethyldodecylamine and dodecylamine; reaction product of these amines and acidic phosphoric ester; and alkaline compound such as sodium hydroxide and potassium hydroxide; alkylmercaptan such as n-dodecylmercaptan and tert-butylmercaptan; mercaptosilane such as r-mercaptopropyltrimethoxysilane; carboxylic acid such as 2-mercaptopropionic acid and thiosalicylic acid; ester compound such as thioglycolic acid-2-ethylhexyl; polymer such as CAPCURE3-800 (manufactured by Diamond Shamlock Chemicals, polyether having mercapto group at both ends); and compound having mercapto group such as thiophenol and thiobenzoic acid. Among these curing catalysts, organic tin compound, acidic phosphoric acid, amines, reaction product of acidic phosphoric acid ester and amine, saturated or unsaturated multivalent carboxylic acid or acid anhydride thereof, reactive silicon compound, organic titanate compound, organic aluminum compound or mixture thereof are preferable. Organic tin compound or curing catalyst containing organic tin compound is more preferable, and particularly, a curing catalyst containing organic tin compound and at least one of amine and mercapto compound is most preferable.

As the inorganic polymer for anti-glare film 10, TSB4200, TSB4300, TSB4400, BELCLEAN or the like may preferably be used, for example.

Average thickness of anti-glare film 10 should preferably be in the range of 0.1 to 500 μm. The reason is as follows. When the thickness of anti-glare film 10 is not thicker than 0.1 μm, it becomes difficult to form roughness suitable for light scattering and, by contrast, when the thickness exceeds 500 μm, light transmittance of anti-glare film 10 is degraded, possibly reducing the amount of light reaching the solar battery 5. The thickness range of anti-glare film 10 is preferably 0.5 to 100 μm, and more preferably, 1 to 30 μm.

Anti-glare film 10 may be formed on an outer surface of cover glass 1 after the completion of solar battery module. Anti-glare film 10, however, may be formed at any time after the second electrode layer is formed and scribed. Namely, the anti-glare film 10 may be formed immediately after the formation and the scribing of the second electrode, or it may be formed after the back surface is sealed, after the terminal box is attached, or even after installation on a roof, and the timing is not specifically limited, though dependent on the method of application.

Figure 8:
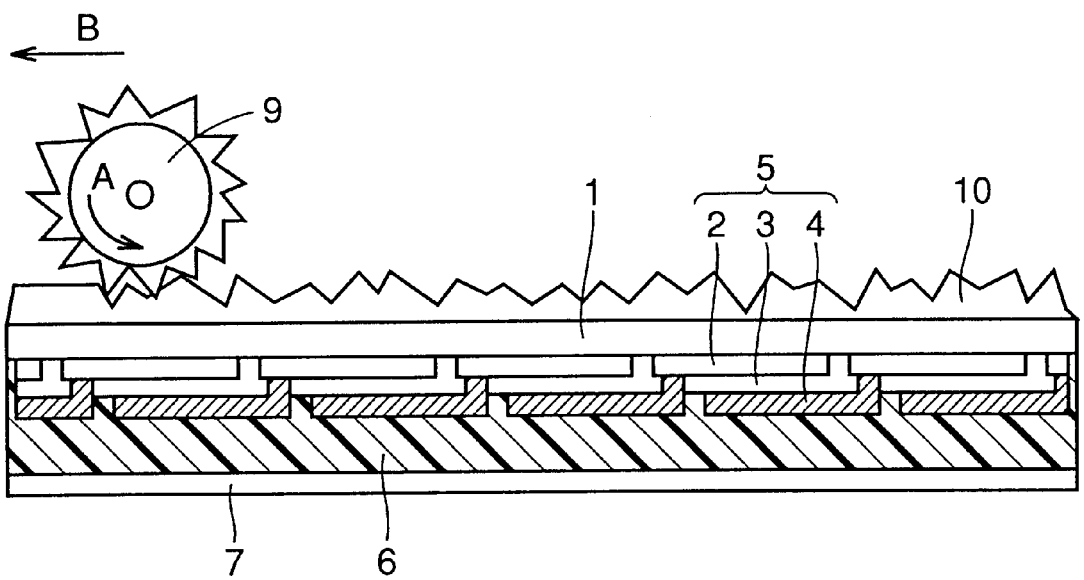
FIG. 8 is a schematic cross section representing a step of forming an anti-glare film having fine uneven surface on a cover glass of the solar battery module.

The material for the anti-glare film may be applied to a prescribed thickness on glass substrate 1 by using a music wire coater, spray, or screen printing, for example. As shown in FIG. 8, by using an embossed roller 9 rotating in the direction of the arrow A and moved in the direction of the arrow B, fine roughness can be formed on the surface of anti-glare film 10. Formation of the fine surface roughness can be done not by the embossed roll but by transferring an embossed film, sandblasting or the like. Before hardening, the material applied as the anti-glare film is far softer than glass substrate 1, and therefore such process for forming roughness on the surface can be readily done without damaging any other portion of the solar battery module.

A dirt preventing film having a smooth surface may additionally be applied to the roughened surface of anti-glare film 10. More specifically, the surface of anti-glare film 10 having such fine roughness tends to collect dirt. When the roughened surface is made flat by the dirt preventing film, dirt or contamination of the surface of the solar battery module can be reduced.

The polymer material for the anti-glare film has an index of refraction between air and the glass substrate, and therefore anti-glare film 10 also has an effect of improving light transmittance to solar cell 5. In order to further improve light transmittance to solar cell 5, anti-glare film 10 may be formed to include a plurality of anti-glare sublayers. It is preferred that the anti-glare sublayers are formed by materials having different composition or physical properties. By the plurality of sublayers having different indexes of refraction, inclination of the indexes of refraction can be generated in the anti-glare film 10, and hence light transmittance to solar cell 5 can further be improved.

As the material of anti-glare film 10 described above, an organic polymer is preferred in that it is soft and not prone to cracks, while inorganic polymer is preferred in that it has high weather resistance and high heat resistance.

Anti-glare film 10 formed as described above and the additional dirt preventing film cover the entire surface of glass substrate 1, and therefore difference in tone of glass substrate 1 resulting from variation of manufactures or lots can be masked, so that a plurality of solar battery modules arranged on a roof comes to have uniform tone and improved appearance.

Figure 9:
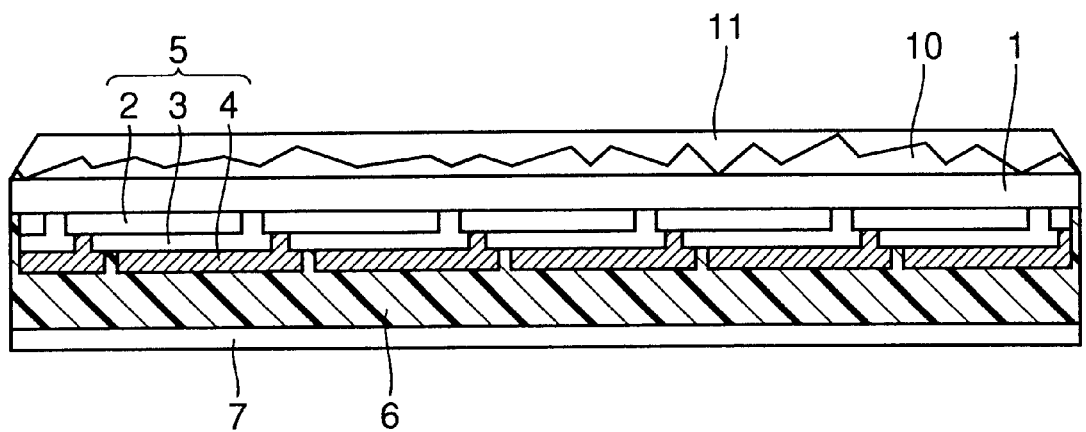
FIG. 9 is a schematic cross section representing a state where a dirt preventing film is further added on the anti-glare film of the solar battery module.

FIG. 9 is a schematic cross section showing a portion of a thin film solar battery module as a still further example of the embodiment of the present invention.

The thin film solar battery module shown in FIG. 9 has a similar structure as the thin film solar battery module shown in FIG. 8, and it is characterized in that on the roughened surface texture of anti-glare film 10, a surface film (dirt preventing film) 11 planarizing the roughness is formed. As the material of surface film 11, an organic polymer, an inorganic polymer or a composite material thereof may be used.

As the organic polymer used for the surface film 11 of the present embodiment, an acrylic resin, a fluororesin, a mixed resin thereof, or a material containing such resin or mixed resin, similar to those for the organic material binder used in the embodiment of FIG. 1, may be used.

As to the properties of the polymer for anti-glare film 10, a material which has sufficient wear resistance and good light transmittance and hardens at a temperature not degrading the solar cell in the process of hardening, specifically at a temperature not higher than 200° C. and more preferably not higher than 150° C. is desirable.

As the raw material of the inorganic polymer contained in surface film 11, alkyl silicate similar to those for the inorganic polymer used for anti-glare film 10 in the embodiment shown in FIG. 7 may be used.

Average thickness of surface film 11 should preferably be in the range of 0.1 to 10 μm. The reason is as follows. When the thickness of surface film 11 is not larger than 0.1 μm, it becomes difficult to make flat the texture of the roughened surface, and when the thickness exceeds 10 μm, light transmittance would be degraded, possibly reducing the amount of light reaching solar cell 5.

As the material for anti-glare film 10, similar material as surface film 11 may be used. In view of the light scattering effect of anti-glare film 10, surface film 11 and anti-glare film 10 should preferably be formed of different materials. Even when surface film 11 and anti-glare film 10 are formed of the same material, however, once formed roughened surface of anti-glare film 10 provides a distinctive interface with surface film 11, and therefore, by the roughened interface, the light scattering effect can be maintained. Therefore, the roughened surface of anti-glare film 10 may be made flat by surface film 11 to reduce deposition of dirt, or surface film 11 may be so formed as to maintain roughness, with higher priority given to the anti-glare effect.

When surface film 11 is formed of a fluororesin to prevent dirt, the surface has superior water repellancy, reducing deposition of dirt and the like resulting from rain, for example. When surface film 11 is formed of an alkyl silicate, chemical resistance of the surface of the solar battery module improves, and hydrophilic nature is improved, so that even when stained by dirt, the stain would be spread uniformly, and hence becomes less noticeable.

In order to improve hardness, wear resistance and weather resistance of surface film 11, an inorganic polymer may preferably be used, and in order to prevent cracks, an organic polymer is preferably used.

Surface film 11 formed as described above covers the entire surface of glass substrate 1, and therefore difference in tone of glass substrate 1 resulting from variation of manufactures or lots can be masked, so that a plurality of solar battery modules arranged on a roof comes to have uniform tone and improved appearance.

Figure 10:
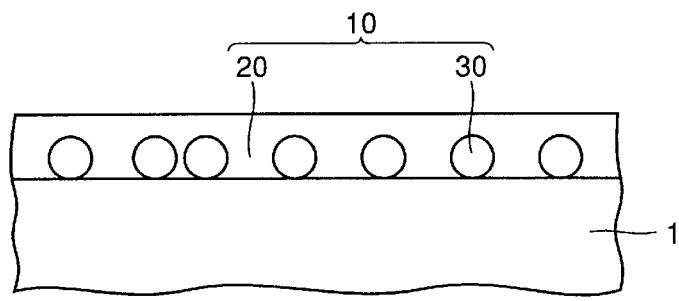
FIG. 10 is a cross section showing, partially in enlargement, the portion of the anti-glare film of a still further example of the solar battery module in accordance with the present invention.
Figure 11:
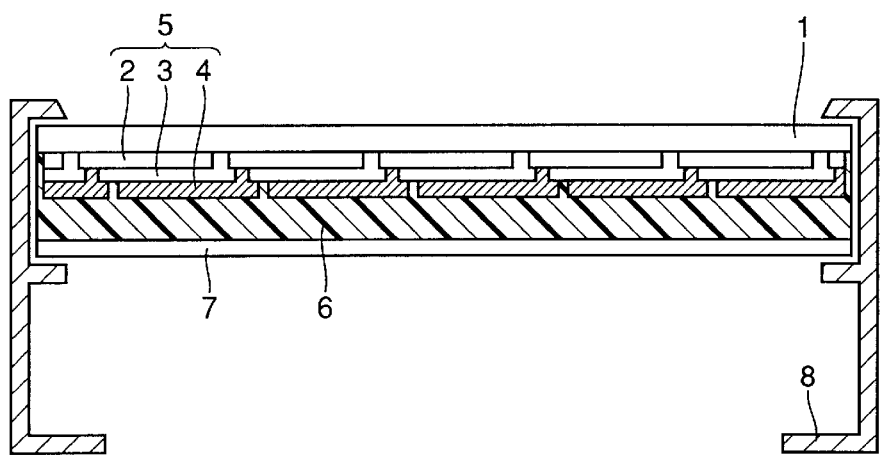
FIG. 11 is a cross section representing a schematic structure of an example of the conventional solar battery module.

FIG. 10 is a cross section showing, partially in enlargement, a portion of anti-glare film 10 in accordance with a still further example of the solar battery module of the present invention.

Though an example in which fine roughness is provided on the surface of the anti-glare film has been mainly described, the surface of the anti-glare film may be flat as shown in FIG. 10 to exhibit anti-glaring effect, dependent on the difference in indexes of refraction between the binder and the particles, for example.

In the solar battery module in accordance with the present invention, in order to attain the anti-glare effect, preferably, the anti-glare film has arithmetic mean roughness Ra of 0.1 to 10 μm, more preferably 0.2 to 5 μm and most preferably, 0.2 to 2 μm.

The anti-glare films were actually formed under various conditions on a glass substrate and optical characteristics and the like were evaluated. The results are as described in the following.

EXAMPLE 1

A TCO (Transparent Conductive Oxide) film was formed on one surface of a glass substrate having flat surfaces, and an anti-glare film was formed on the other surface under the following conditions.

First, "GEMLAC3623" manufactured by KANEKA CORPORATION was used as an organic binder, BT120S manufactured by KANEKA CORPORATION (mixture or reaction product of organic tin compound, amines and mercapto compound) as a curing agent and xylene as a diluent were added, and diluted until solids concentration attained to 25%.

PMMA "MBX-8" (φ8 μm) manufactured by Sekisui Kasei was used as organic material particles, which particles were dispersed by using a shaker in the above described binder resin. The mixing ratio of the particles was adjusted to binder resin:particles=100:10.

The liquid obtained in this manner was applied by spray on the glass substrate, dried for five minutes at a room temperature, and further dried for 30 minutes at 80° C.

In this manner, a sample of Example 1 having a TCO film on one surface and an irregular reflection film formed on the other surface of the glass substrate was obtained.

The sample of Example 1 was irradiated with light from the surface on which the anti-glare film was formed, "60° gloss", "20° gloss" and "full transmittance" were measured and optical characteristics were evaluated.

"60° gloss" was the 60° specular gross measured in accordance with the specular gross measuring method in compliance with JIS Z8741-1983.

"20° gloss" was the 20° specular gloss measured in accordance with the specular gloss measuring method in compliance with JIS Z8741-1983.

Thereafter, film thickness measurement and X cut test were conducted on the sample of Example 1, and the initial film was evaluated.

"X cut test" was conducted in accordance with JIS K5400, and the result was evaluated such that when the film was peeled off from the entire surface, the point was 0 and when there was no defect, the point was 10. That is, the better the result, the higher the point.

Further, durability test was conducted in accordance with JIS C 8938 and the film thereafter was evaluated, for the sample of Example 1.

Durability test was conducted under three different conditions, that is, ① left at 85° C. for 264 hours, ② left at 85° C., moisture 85% for 270 hours, and ③ subjected to 10 cycles between 85° C., moisture 85% and −20° C. The film after test was subjected to X cut test and appearance evaluation.

EXAMPLE 2

The mixing ratio of particles was adjusted to binder resin:particles=100:20, and samples of Example 2 were fabricated in the similar manner as Example 1.

The sample of Example 2 obtained in this manner was subjected to evaluation of optical characteristics, evaluation of initial film and evaluation of the film after durability test, in the similar manner as Example 1.

EXAMPLE 3

Using PE "SE480-10T" (average φ15 μm, maximum φ30 μm) manufactured by Sumitomo Kasei was used as organic material particles, mixing ratio of the particles was adjusted to binder resin:particles=100:2.5, and a sample of Example 3 was fabricated in the similar manner as Example 1.

The sample of Example 3 obtained in this manner was subjected to evaluation of optical characteristics, evaluation of initial film and evaluation of the film after durability test, in the similar manner as Example 1.

EXAMPLE 4

The sample of Example 4 was fabricated in the similar manner as Example 3, with mixing ratio of particles adjusted to binder resin:particles=100:5.

The sample of Example 4 obtained in this manner was subjected to evaluation of optical characteristics, evaluation of initial film and evaluation of the film after durability test, in the similar manner as Example 1.

Comparative Example 1

A sample of a Comparative Example 1 was fabricated, in which a TCO film was formed on one surface and no anti-glare film formed on the other surface, of the glass substrate having flat surfaces similar to that of Example 1.

Optical characteristics of the sample of Comparative Example 1 obtained in this manner was evaluated in the similar manner as Example 1.

The arithmetic mean roughness Ra of Comparative Example 1 was measured in the similar manner as Example 5. As a result, the arithmetic mean roughness of Comparative Example 1 was 0.010 μm.

Comparative Example 2

Figure 12:
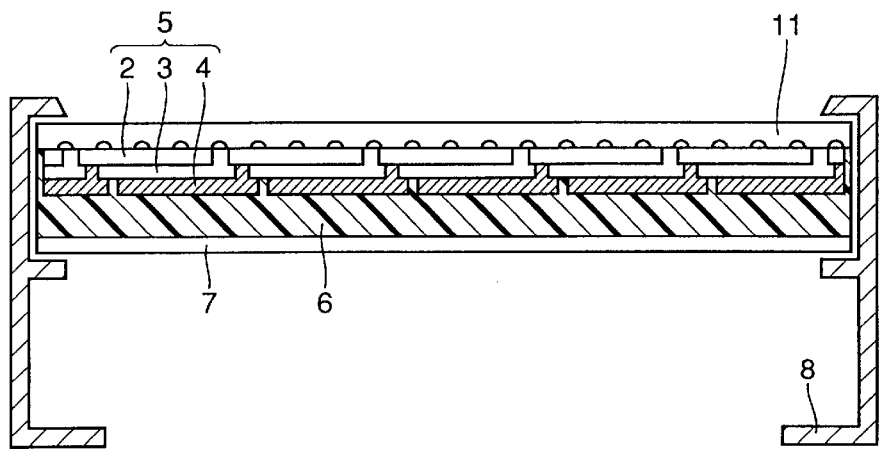
FIG. 12 is a cross section showing a schematic structure of another example of the conventional solar battery module.

FIG. 12 is a cross sectional view showing a schematic structure of another example of the conventional solar battery module.

Referring to FIG. 12, in the solar battery module, a reinforced embossed glass 111 of which semiconductor layer forming surface made rough by emboss processing is used as the glass substrate.

The reinforced embossed glass 111 used in the conventional solar battery module was used as a sample of Comparative Example 2, the sample of comparative Example 2 was also irradiated with light from the direction opposite to the surface having roughness, and optical characteristics were evaluated in the similar manner as Example 1.

Film forming conditions and results of evaluation of Examples 1 to 4 and Comparative Examples 1 and 2 are collectively given in Tables 2 to 4.

TABLE 2

| | Glass Substrate | Substrate Pre-processing | Binder Resin | Binder Pre-processing | Particle | Mixing ratio binder/particles | Condition of application | Condition of drying |
|---|---|---|---|---|---|---|---|---|
| Example 1 | +TCO | — | GEMLAC Y3623 | + Curing agent diluent | MBX-8 | 100/10 | spray, once | Room temp. 5 min. 80° C., 30 min. |
| Example 2 | +TCO | — | GEMLAC Y3623 | + Curing agent diluent | MBX-8 | 100/20 | spray, once | Room temp. 5 min. 80° C., 30 min. |
| Example 3 | +TCO | — | GEMLAC Y3623 | + Curing agent diluent | SE480-10T | 100/2.5 | spray, once | Room temp. 5 min. 80° C., 30 min. |
| Example 4 | +TCO | — | GEMLAC Y3623 | + Curing agent diluent | SE480-10T | 100/5 | spray, once | Room temp. 5 min. 80° C., 30 min. |
| Comparative Example 1 | +TCO | — | — | — | — | — | — | — |
| Comparative Example 2 | Reinforced roughened glass | — | — | — | — | — | — | — |

TABLE 3

| | Optical Characteristics Evaluation | | | Initial Film Evaluation | |
|---|---|---|---|---|---|
| | 60° gloss | 20° gloss | Full Transmittance(%) | Film thickness (μm) | X cut test |
| Example 1 | 36 | 11 | 80.6 | 14 | 10 |
| Example 2 | 15 | 1 | 80.3 | 14 | 10 |
| Example 3 | 40 | 9 | 79.1 | 12 | 10 |
| Example 4 | 17 | 1 | 78.1 | 11 | 10 |
| Comparative Example 1 | 90 | 83 | 80.8 | — | — |
| Comparative Example 2 | 70 | 26 | 92.4 | — | — |

TABLE 4

| | Film Evaluation After Durability Test | | | | | |
|---|---|---|---|---|---|---|
| | 85° C. × 264 h | | 85° C./85% × 270 h | | 85° C./85%~ −20° C. 10 Cycles | |
| | X cut test | Appearance | X cut test | Appearance | X cut test | Appearance |
| Example 1 | 10 | OK | 6 | OK | 1 | OK |
| Example 2 | 10 | OK | 1 | OK | 1 | OK |
| Example 3 | 10 | OK | 10 | OK | 10 | OK |
| Example 4 | 10 | OK | 10 | OK | 10 | local unevenness observed |

EXAMPLE 5

A TCO (Transparent Conductive Oxide) film was formed on one surface of a glass substrate having flat surfaces, and an anti-glare film was formed on the other surface under the following conditions.

First, "GEMLAC3623" manufactured by KANEKA CORPORATION was used as an organic binder, BT120S manufactured by KANEKA CORPORATION (mixture or reaction product of organic tin compound, amines and mercapto compound) as a curing agent and xylene as a diluent were added, and diluted until solids concentration attained to 25%.

As inorganic particles, silica "TS 100" (φ4 μm) manufactured by Degusa Japan was used, which particles were dispersed by a shaker in the binder resin described above. The mixing ratio of the particles was adjusted to binder resin:particles=100:2.5.

The liquid obtained in this manner was applied by spray on the glass substrate, dried for 5 minutes at a room temperature and further dried for 30 minutes at 80° C.

In this manner, a sample of Example 5 having a TCO film on one surface and an irregular reflection film formed on the other surface of the glass substrate was obtained.

The sample of Example 5 obtained in this manner was subjected to evaluation of optical characteristics, evaluation of initial film and evaluation of the film after durability test, in the similar manner as Example 1.

The arithmetic mean roughness Ra of the anti-glare film of Example 5 was measured. The arithmetic mean roughness was measured by a three-dimensional roughness analysis apparatus ERA-8000 manufactured by ELIONIX. Conditions for measuring were as follows. Magnification of measurement was 2000 times, area of observation was 60 μm×45 μm, the number of measuring points in the X direction was 300 points (abscissa) and the measurement points in the Y direction was 225 points (ordinate).

As a result, the arithmetic mean roughness Ra of the anti-glare film of Example 5 was 0.379 μm.

EXAMPLE 6

A sample of Example 6 was fabricated in the similar manner as Example 5, with the mixing ratio of particles adjusted to binder resin:particles=100:5.

The sample of Example 6 obtained in this manner was subjected to evaluation of optical characteristics, evaluation of initial film and evaluation of the film after durability test, in the similar manner as Example 1.

EXAMPLE 7

A sample of Example 7 was fabricated in the similar manner as Example 6, using GEMLAC YC5920 manufactured by KANEKA CORPORATION in place of GEMLAC Y3623, with mixing ratio of the particles adjusted to binder resin:particles=100:5.

The sample of Example 7 obtained in this manner was subjected to evaluation of optical characteristics, evaluation of initial film and evaluation of the film after durability test, in the similar manner as Example 1.

EXAMPLE 8

A TCO film was formed on one surface of a glass substrate having flat surfaces, the substrate was subjected to surface pre-processing using acetone and IPA (isopropyl alcohol), and an irregular reflection film was formed on the other surface of the substrate under the following conditions.

First, "BONNFLON#2020SR" manufactured by Asahi Glass Company Limited was used as an organic material binder, which was diluted to two times using a dedicated thinner.

Silica "OK-607" (φ2 μm) manufactured by Degusa Japan was used as inorganic particles, which particles were dispersed in the binder resin described above. The mixing ratio was adjusted to binder resin:particles=100:5.

The liquid obtained in this manner was applied by spray on glass substrate, and dried at a room temperature.

In this manner, the sample of Example 8 having TCO film formed on one surface and an irregular reflection film on the other surface of the glass substrate was obtained.

The sample of Example 8 was subjected to evaluation of optical characteristics and initial film, in the similar manner as Example 1.

EXAMPLE 9

A sample of Example 9 was fabricated in the similar manner as Example 8, except that the liquid having particles dispersed in the binder resin was applied twice by spray on glass substrate.

The sample of Example 9 was subjected to evaluation of optical characteristics and initial film, in the similar manner as Example 1.

EXAMPLE 10

A sample of Example 10 was fabricated in the similar manner as Example 8, with the mixing ratio of particles adjusted to binder resin:particles=100:3.

The sample of Example 10 obtained in this manner was subjected to evaluation of optical characteristics and initial film, in the similar manner as Example 1.

EXAMPLE 11

A sample of Example 11 was fabricated in the similar manner as Example 10 except that the liquid having particles dispersed in the binder resin was applied twice by spray on the glass substrate.

The sample of Example 11 obtained in this manner was subjected to evaluation of optical characteristics and initial film, in the similar manner as Example 1.

EXAMPLE 12

A sample of Example 12 was fabricated in the similar manner as Example 8, by using BONNFLON#2020SR only as the binder resin without using the diluent, with the mixing ratio of particles adjusted to binder resin:particles=100:5.

The sample of Example 12 obtained in this manner was subjected to evaluation of optical characteristics and initial film, in the similar manner as Example 1.

The arithmetic mean roughness Ra of Example 12 was measured in the similar manner as in Example 5. As a result, the arithmetic mean roughness Ra of Example 12 was 0.386 μm.

EXAMPLE 13

A sample of Example 13 was fabricated in the similar manner as Example 12 except that the liquid having particles dispersed in the binder resin was applied twice by spray on the glass substrate.

The sample of Example 13 obtained in this manner was subjected to evaluation of optical characteristics and initial film, in the similar manner as Example 1.

EXAMPLE 14

A sample of Example 14 was fabricated in the similar manner as Example 8, by using acetone only for surface pre-processing of the substrate, adjusting mixing ratio of particles to binder resin:particles=100:5. The liquid having particles dispersed in the binder resin was applied by No. 8 music wire coater on the glass substrate.

The sample of Example 14 obtained in this manner was subjected to evaluation of optical characteristics and initial film, in the similar manner as Example 1.

EXAMPLE 15

A sample of Example 15 was fabricated in the similar manner as Example 14 except that a No. 16 music wire coater was used.

The sample of Example 15 obtained in this manner was subjected to evaluation of optical characteristics and initial film, in the similar manner as Example 1.

EXAMPLE 16

A sample of Example 16 was fabricated in the similar manner as Example 14, with mixing ratio of particles adjusted to binder resin:particles=100:3 and using No. 8 music wire coater.

The sample of Example 16 obtained in this manner was subjected to evaluation of optical characteristics and initial film, in the similar manner as Example 1.

EXAMPLE 17

A sample of Example 17 was fabricated in the similar manner as Example 16 except that a number 16 music wire coater was used.

The sample of Example 17 obtained in this manner was subjected to evaluation of optical characteristics and initial film, in the similar manner as Example 1.

EXAMPLE 18

A sample of Example 18 was fabricated in the similar manner as Example 14, with mixing ratio of particles adjusted to binder resin:particles=100:5 and using No. 8 music wire coater.

The sample of Example 18 obtained in this manner was subjected to evaluation of optical characteristics and initial film, in the similar manner as Example 1.

EXAMPLE 19

A sample of Example 19 was fabricated in the similar manner as Example 18 except that a No. 16 music wire coater was used.

The sample of Example 19 obtained in this manner was subjected to evaluation of optical characteristics and initial film, in the similar manner as Example 1.

EXAMPLE 20

A sample of Example 20 was fabricated in the similar manner as Example 16 except that silica sol "EG-ST-ZL" ($\phi$0.07 to 0.1 $\mu$m) manufactured by Nissan Kagaku Kogyo was used as inorganic material particles with the mixing ratio of particles adjusted to binder resin:particles=100:1900.

The sample of Example 20 obtained in this manner was subjected to evaluation of optical characteristics and initial film, in the similar manner as Example 1.

EXAMPLE 21

A sample of Example 21 was fabricated in the similar manner as Example 20 with mixing ratio of particles adjusted to binder resin:particles=100:900.

The sample of Example 21 obtained in this manner was subjected to evaluation of optical characteristics and initial film, in the similar manner as Example 1.

EXAMPLE 22

A sample of Example 22 was fabricated in the similar manner as Example 20 with mixing ratio of particles adjusted to binder resin:particles=100:400.

The sample of Example 22 obtained in this manner was subjected to evaluation of optical characteristics and initial film, in the similar manner as Example 1.

EXAMPLE 23

A sample of Example 23 was fabricated in the similar manner as Example 20 with mixing ratio of particles adjusted to binder resin:particles=100:90.

The sample of Example 23 obtained in this manner was subjected to evaluation of optical characteristics and initial film, in the similar manner as Example 1.

EXAMPLE 24

A sample of Example 24 was fabricated in the similar manner as Example 20 with the mixing ratio of particles adjusted to binder resin:particles=100:67.

The sample of Example 24 obtained in this manner was subjected to evaluation of optical characteristics and initial film, in the similar manner as Example 1.

Conditions of film formation and results of evaluation of the anti-glare films of Examples 5 to 24 and Comparative Examples 1 and 2 are collectively given in Tables 5 to 7.

TABLE 5

|  | Glass Substrate | Substrate Pre-processing | Binder Resin | Binder Pre-processing | Particle | Mixing ratio binder/particles | Condition application | Condition of drying |
|---|---|---|---|---|---|---|---|---|
| Example 5 | +TCO | — | GEMLAC Y3623 | +Curing agent, diluent | TS100 | 100/2.5 | spray, once | Room temp. 5 min. 80° C., 30 min. |
| Example 6 | +TCO | — | GEMLAC Y3623 | +Curing agent, diluent | TS100 | 100/5 | spray, once | Room temp. 5 min. 80° C., 30 min. |
| Example 7 | +TCO | — | GEMLAC YC5920 | +Curing agent, diluent | TS100 | 100/5 | spray, once | Room temp., 5 min, 80° C., 30 min. |
| Example 8 | +TCO | +Acetone, IPA | BONNFLON #2020SR | +diluent | OK-607 | 100/5 | spray, once | Room temp. |
| Example 9 | +TCO | +Acetone, IPA | BONNFLON #2020SR | +diluent | OK-607 | 100/5 | spray, two times | Room temp. |
| Example 10 | +TCO | +Acetone, IPA | BONNFLON #2020SR | +diluent | OK-607 | 100/3 | spray, once | Room temp. |
| Example 11 | +TCO | +Acetone, IPA | BONNFLON #2020SR | +diluent | OK-607 | 100/3 | spray, two times | Room temp. |
| Example 12 | +TCO | +Acetone, IPA | BONNFLON #2020SR | — | OK-607 | 100/5 | spray, once | Room temp. |
| Example 13 | +TCO | +Acetone, IPA | BONNFLON #2020SR | — | OK-607 | 100/5 | spray, two times | Room tomp. |
| Example 14 | +TCO | +Acetone | BONNFLON #2020SR | +diluent | OK-607 | 100/5 | $\phi$/8 music wire | Room temp. |

TABLE 5-continued

| | Glass Substrate | Substrate Pre-processing | Binder Resin | Binder Pre-processing | Particle | Mixing ratio binder/particles | Condition application | Condition of drying |
|---|---|---|---|---|---|---|---|---|
| Example 15 | +TCO | +Acetone | BONNFLON #2020SR | +diluent | OK-607 | 100/5 | φ/16 music wire | Room temp. |
| Example 16 | +TCO | +Acetone | BONNFLON #2020SR | +diluent | OK-607 | 100/3 | φ/8 music wire | Room temp. |
| Example 17 | +TCO | +Acetone | BONNFLON #2020SR | +diluent | OK-607 | 100/3 | φ/16 music wire | Room temp. |
| Example 18 | +TCO | +Acetone | BONNFLON #2020SR | — | OK-607 | 100/5 | φ/8 music wire | Room temp. |
| Example 19 | +TCO | +Acetone | BONNFLON #2020SR | — | OK-607 | 100/5 | φ/16 music wire | Room temp. |
| Example 20 | +TCO | +Acetone | BONNFLON #2020SR | +diluent | EG-ST-ZL | 100/1900 | φ/8 music wire | Room temp. |
| Example 21 | +TCO | +Acetone | BONNFLON #2020SR | +diluent | EG-ST-ZL | 100/900 | φ/8 music wire | Room temp. |
| Example 22 | +TCO | +Acetone | BONNFLON #2020SR | +diluent | EG-ST-ZL | 100/400 | φ/8 music wire | Room temp. |
| Example 23 | +TCO | +Acetone | BONNFLON #2020SR | +diluent | EG-ST-ZL | 100/90 | φ/8 music wire | Room temp. |
| Example 24 | +TCO | +Acetone | BONNFLON #2020SR | +diluent | EG-ST-ZL | 100/67 | φ/8 music wire | Room temp. |
| Comparative Example 1 | +TCO | — | — | — | — | — | — | — |
| Comparative Example 2 | Reinforced roughened glass | — | — | — | — | — | — | — |

TABLE 6

| | Optical Characteristics Evaluation | | | Initial Film Evaluation | |
|---|---|---|---|---|---|
| | 60° gloss | 20° gloss | Full Transmittance(%) | Film thickness (μm) | X cut test |
| Example 5 | 49 | 18 | 79.3 | 11 | 10 |
| Example 6 | 20 | 1 | 78.9 | 15 | 10 |
| Example 7 | 21 | 1 | 78.5 | 6 | 10 |
| Example 8 | 15 | 2 | 81.3 | 2 | 10 |
| Example 9 | 23 | 2 | 80.3 | 11 | 10 |
| Example 10 | 41 | 6 | 80.4 | 2 | 10 |
| Example 11 | 38 | 12 | 79.7 | 4 | 10 |
| Example 12 | 59 | 9 | 80.1 | 9 | 10 |
| Example 13 | 59 | 13 | 80.7 | 13 | 10 |
| Example 14 | 13 | 0 | 80.0 | 2 | 10 |
| Example 15 | 16 | 0 | 78.6 | 4 | 10 |
| Example 16 | 45 | 12 | 81.6 | 2 | 10 |
| Example 17 | 38 | 11 | 80.5 | 4 | 10 |
| Example 18 | 25 | 0 | 78.9 | 4 | 10 |
| Example 19 | 43 | 5 | 79.7 | 8 | 10 |
| Example 20 | 49 | 10 | 78.9 | 1> | 10 |
| Example 21 | 41 | 11 | 80.1 | 1 | 10 |
| Example 22 | 30 | 4 | 79.9 | 2 | 10 |
| Example 23 | 5 | 1 | 79.8 | 3 | 8 |
| Example 24 | 18 | 1 | 79.4 | 2 | 8 |
| Comparative Example 1 | 90 | 83 | 80.8 | — | — |
| Comparative Example 2 | 70 | 26 | 92.4 | — | — |

TABLE 7

| | Film Evaluation After Durability Test | | | | | |
|---|---|---|---|---|---|---|
| | 85° C. × 264 h | | 85° C./85% × 270 h | | 85° C./85%~ −20° C. 10 Cycles | |
| | X cut test | Appearance | X cut test | Appearance | X cut test | Appearance |
| Example 5 | 10 | OK | 2 | OK | 2 | OK |
| Example 6 | 10 | OK | 0 | OK | 10 | OK |
| Example 7 | 10 | OK | 10 | OK | 10 | OK |

EXAMPLE 25

A TCO (Transparent Conductive Oxide) film was formed on one surface of a glass substrate having flat surfaces, surface pre-processing of the substrate was conducted using toluene and acetone, and an anti-glare film was formed on the other surface of the substrate under the following conditions.

First, "TSB4300" manufactured by T.S.B Corporation was used as an inorganic material binder, to which ethanol was added.

PMMA "MBX-8" (φ8 μm) was used as organic material particles, which particles were dispersed in the binder described above. The mixing ratio of the particles was adjusted to binder: particles=100:10.

The liquid obtained in this manner was applied by spray on the glass substrate, dried for ten minutes by air drying, and thereafter dried for one hour at 60° C. and further one hour at 120° C.

In this manner, a sample of Example 25 having the TCO film on one surface and an irregular reflection film on the other surface of the glass substrate was obtained.

The sample of Example 25 obtained in this manner was subjected to evaluation of optical characteristics and initial film, in the similar manner as Example 1.

EXAMPLE 26

A sample of Example 26 was fabricated in the similar manner as Example 25, with the mixing ratio of particles adjusted to binder: particles=100:20.

The sample of Example 26 obtained in this manner was subjected to evaluation of optical characteristics and initial film, in the similar manner as Example 1.

EXAMPLE 27

A sample of Example 27 was fabricated in the similar manner as Example 25 by using PE "SE480-10T" (average φ15 μm, maximum φ30 μm) manufactured by Kusumoto Kasei was used as organic material particles with the mixing ratio of the particles adjusted to binder:particles=100:2.5.

The sample of Example 27 obtained in this manner was subjected to evaluation of optical characteristics and initial film, in the similar manner as Example 1.

EXAMPLE 28

A sample of Example 28 was fabricated in the similar manner as Example 27 with the mixing ratio of particles adjusted to binder:particles=100:5.

The sample of Example 28 obtained in this manner was subjected to evaluation of optical characteristics and initial film, in the similar manner as Example 1.

The conditions of film formation and the results of evaluation of the anti-glare films of Examples 25 to 28 and Comparative Examples 1 and 2 are as shown in Tables 8 and 9.

EXAMPLE 29

A TCO (Transparent Conductive Oxide) film was formed on one surface of a glass substrate having flat surfaces, surface pre-processing of the substrate was conducted using toluent and acetone, and an anti-glare film was formed on the other surface of the substrate under the following conditions.

First, "TSB4400" manufactured by T.S.B Corporation was used as an inorganic material binder, and HCl was added as hydrolyzable catalyst.

Silica sol "EG-ST-ZL" (φ0.07 to 0.1 μm) manufactured by Nissan Kagaku Kogyo was used as inorganic material particles, which particles were dispersed manually in the binder described above. The mixing ratio of the particles was adjusted to binder:particles=5:95.

The liquid obtained in this manner was applied by No. 8 bar coater, dried for 10 minutes by air drying, and thereafter dried for one hour at 60° C. and further an hour at 120° C.

TABLE 8

|  | Glass Substrate | Substrate Pre-processing | Binder Resin | Binder Pre-processing | Particle | Mixing ratio binder/particles | Condition of application | Condition of drying |
|---|---|---|---|---|---|---|---|---|
| Example 25 | +TCO | +Toluene, acetone | TSB4300 | +Ethanol | MBX-8 | 100/10 | spray, once | Air dry, 10 min. 60° C., 1 h 120° C., 1 h |
| Example 26 | +TCO | +Toluene, acetone | TSB4300 | +Ethanol | MBX-8 | 100/20 | spray, once | Air dry, 10 min. 60° C., 1 h 120° C., 1 h |
| Example 27 | +TCO | +Toluene, acetone | TSB4300 | +Ethanol | SE480-10T | 100/2.5 | spray, once | Air dry, 10 min. 60° C., 1 h 120° C., 1 h |
| Example 28 | +TCO | +Toluene, acetone | TSB4300 | +Ethanol | SE480-10T | 100/5 | spray. once | Air dry, 10 min. 60° C., 1 h 120° C., 1 h |
| Comparative Example 1 | +TCO | — | — | — | — | — | — | — |
| Comparative Example 2 | Reinforced roughened glass | — | — | — | — | — | — | — |

TABLE 9

| | Optical Characteristics Evaluation | | | Initial Film Evaluation | |
|---|---|---|---|---|---|
| | 60° gloss | 20° gloss | Full transmittance(%) | Film thickness (μm) | X cut test |
| Example 25 | 41 | 10 | 79.9 | 7 | 10 |
| Example 26 | 12 | 3 | 79.8 | 8 | 10 |
| Example 27 | 48 | 12 | 78.8 | 10 | 10 |
| Example 28 | 20 | 4 | 78.0 | 11 | 10 |
| Comparative Example 1 | 90 | 83 | 80.8 | — | — |
| Comparative Example 2 | 70 | 26 | 92.4 | — | — |

In this manner, a sample of Example 29 having the TCO film on one surface and an irregular reflection film on the other surface of the glass substrate was obtained.

The sample of Example 29 obtained in this manner was subjected to evaluation of optical characteristics, evaluation of initial film and evaluation of the film after durability test, in the similar manner as Example 1.

EXAMPLE 30

A sample of Example 30 was fabricated in the similar manner as Example 29, with the mixing ratio of particles adjusted to binder:particles=10:90.

The sample of Example 30 obtained in this manner was subjected to evaluation of optical characteristics, evaluation of initial film and evaluation of the film after durability test, in the similar manner as Example 1.

EXAMPLE 31

A sample of Example 31 was fabricated in the similar manner as Example 29, with the mixing ratio of particles adjusted to binder:particles=20:80.

The sample of Example 31 obtained in this manner was subjected to evaluation of optical characteristics, evaluation of initial film and evaluation of the film after durability test, in the similar manner as Example 1.

EXAMPLE 32

A sample of Example 32 was fabricated in the similar manner as Example 29, except that the mixing ratio of the particles was adjusted to binder:particles=20:80 and that the liquid having the particles dispersed in the binder was applied by using an applicator of 30 μm on the glass substrate.

The sample of Example 32 was subjected to evaluation of optical characteristics, evaluation of initial film and evaluation of the film after durability test in the similar manner as Example.

EXAMPLE 33

A TCO film was formed on one surface of a glass substrate having flat surfaces, and an irregular reflection film was formed on the other surface of the substrate under the following conditions, without any surface pre-processing of the substrate.

First, "TSB4300" manufactured by T.S.B Corporation was used as inorganic material binder, and ethanol was added thereto.

Silica "OK-412" (φ4 μm) manufactured by Degusa Japan was used as inorganic material particles, which particles were dispersed by using a dispersing vane in the binder described above. The mixing ratio was adjusted to binder:particles=80:20.

The liquid obtained in this manner was applied by No. 8 bar coater, dried for 10 minutes by air drying, and thereafter dried for one hour at 60° C. and further an hour at 120° C.

In this manner, a sample of Example 33 having the TCO film on one surface and an irregular reflection film on the other surface of the glass substrate was obtained.

The sample of Example 33 was subjected to evaluation of optical characteristics and evaluation of initial film in the similar manner as Example 1.

EXAMPLE 34

A sample of Example 34 was fabricated in the similar manner as Example 33 with the mixing ratio of particles adjusted to binder:particles=90:10.

The sample of Example 34 obtained in this manner was subjected to evaluation of optical characteristics and evaluation of initial film in the similar manner as Example 1.

EXAMPLE 35

A sample of Example 35 was fabricated in the similar manner as Example 33 with the mixing ratio of particles adjusted to binder:particles=95:5.

The sample of Example 35 obtained in this manner was subjected to evaluation of optical characteristics and evaluation of initial film in the similar manner as Example 1.

EXAMPLE 36

Example 36 was fabricated by adjusting the mixing ratio of particles to binder:particles=98:2, applying the liquid in which the particles were dispersed in the binder to the glass substrate and not performing special drying process.

The sample of Example 36 was subjected to evaluation of optical characteristics and evaluation of initial film in the similar manner as Example 1.

EXAMPLE 37

A sample of Example 37 was fabricated in the similar manner as Example 36 by using silica "TS100" (φ4 μm) manufactured by Degusa Japan as inorganic material particles, with the mixing ratio of particles adjusted to binder:particles=95:5.

The sample of Example 37 obtained in this manner was subjected to evaluation of optical characteristics and evaluation of initial film in the similar manner as Example 1.

EXAMPLE 38

A sample of Example 38 was fabricated in the similar manner as Example 37 with the mixing ratio of particles adjusted to binder:particles=98:2.

The sample of Example 38 obtained in this manner was subjected to evaluation of optical characteristics and evaluation of initial film in the similar manner as Example 1.

EXAMPLE 39

A sample of Example 39 was fabricated in the similar manner as Example 37 with the mixing ratio of particles adjusted to binder:particles=99:1.

The sample of Example 39 obtained in this manner was subjected to evaluation of optical characteristics and evaluation of initial film in the similar manner as Example 1.

EXAMPLE 40

A sample of Example 40 was fabricated in the similar manner as Example 37 by using "TSB4200" manufactured by T.S.B Corporation as the binder, using silica sol "EG-ST-ZL" (φ0.07 to 0.1 μm) manufactured by Nissan Kagaku Kogyo as inorganic material particles, with the mixing ratio of the particles adjusted to binder:particles=60:40.

The sample of Example 40 obtained in this manner was subjected to evaluation of optical characteristics and evaluation of initial film in the similar manner as Example 1.

EXAMPLE 41

A sample of Example 41 was fabricated in the similar manner as Example 40 except that the liquid having particles dispersed in the binder was applied by using a No. 3 bar coater on the glass substrate.

The sample of Example 41 obtained in this manner was subjected to evaluation of optical characteristics and evaluation of initial film in the similar manner as Example 1.

EXAMPLE 42

A sample of Example 42 was fabricated in the similar manner as Example 41 except that the mixing ratio of the particles was adjusted to binder:particles=40:60.

The sample of Example 42 obtained in this manner was subjected to evaluation of optical characteristics and evaluation of initial film in the similar manner as Example 1.

EXAMPLE 43

A sample of Example 43 was fabricated in the similar manner as Example 42 with the mixing ratio of particles adjusted to binder:particles=20:80.

The sample of Example 43 obtained in this manner was subjected to evaluation of optical characteristics and evaluation of initial film in the similar manner as Example 1.

EXAMPLE 44

A TCO film was formed on one surface of a glass substrate having flat surfaces, surface pre-processing of the substrate was performed using toluene, and an irregular reflection film was formed on the other surface of the substrate under the following conditions.

First, "BELCLEAN" manufactured by Nippon Yushi Kabushiki Kaisha having organic material resin mixed therein was used as an inorganic material binder without dilution, to which a curing agent was added.

Silica "TS 100" ($\phi 4$ $\mu$m) was used as inorganic material particles, which particles were dispersed by using a dispersion vane in the binder described above. The mixing ratio of the particles was adjusted to binder:particles=97:3.

The liquid obtained in this manner was applied by using a No. 3 bar coater on the glass substrate, and dried for ten minutes by air drying.

In this manner, a sample of Example 44 having the TCO film on one surface and an irregular reflection film on the other surface of the glass substrate was obtained.

The sample of Example 44 was subjected to evaluation of optical characteristics and evaluation of initial film in the similar manner as Example 1.

EXAMPLE 45

A sample of Example 45 was fabricated in the similar manner as Example 44, except that the liquid having particles dispersed in the binder was applied using a No. 8 bar coater on the glass substrate.

The sample of Example 45 was subjected to evaluation of optical characteristics and evaluation of initial film in the similar manner as Example 1.

EXAMPLE 46

A sample of Example 46 was fabricated in the similar manner as Example 44, except that the liquid having particles dispersed in the binder was applied by using a No. 16 bar coater on the glass substrate.

The sample of Example 46 was subjected to evaluation of optical characteristics and evaluation of initial film in the similar manner as Example 1.

EXAMPLE 47

A sample of Example 47 was fabricated in the similar manner as Example 44 except that the mixing ratio of particles was adjusted to binder:particles=95:5 and that the liquid having particles dispersed in the binder was applied by using a No. 3 bar coater on the glass substrate.

The sample of Example 47 was subjected to evaluation of optical characteristics and evaluation of initial film in the similar manner as Example 1.

EXAMPLE 48

A sample of Example 48 was fabricated in the similar manner as Example 47 except that the liquid having particles dispersed in the binder was applied by using a No. 8 bar coater on the glass substrate.

The sample of Example 48 was subjected to evaluation of optical characteristics and evaluation of initial film in the similar manner as Example 1.

EXAMPLE 49

A sample of Example 49 was fabricated in the similar manner as Example 47 except that the liquid having particles dispersed in the binder was applied by using a No. 16 bar coater on the glass substrate.

The sample of Example 49 was subjected to evaluation of optical characteristics and evaluation of initial film in the similar manner as Example 1.

The conditions of film formation and the results of evaluation of the samples of Examples 29 to 49 and Comparative Examples 1 and 2 described above are as shown in Tables 10 to 12.

TABLE 10

| | Glass Substrate | Substrate Pre-processing | Binder Resin | Binder Pre-processing | Particle | Mixing ratio binder/particles | Condition of application | Condition of drying |
|---|---|---|---|---|---|---|---|---|
| Example 29 | +TCO | +Toluene, acetone | TSB4400 | +HCl | EG-ST-ZL | 5/95 | No. 8 bar coater | Air dry, 10 min. 60° C., 1 h |
| Example 30 | +TCO | +Toluene, acetone | TSB4400 | +HCl | EG-ST-ZL | 10/90 | No. 8 bar coater | 120° C., 1h |
| Example 31 | +TCO | +Toluene, acetone | TSB4400 | +HCl | EG-ST-ZL | 20/80 | No. 8 bar coater | |
| Example 32 | +TCO | +Toluene, acetone | TSB4400 | +HCl | EG-ST-ZL | 20/80 | 30 $\mu$m applicator | |
| Example 33 | +TCO | — | TSB4300 | +Ethanol | OK412 | 80/20 | No. 8 bar coater | |
| Example 34 | +TCO | — | TSB4300 | +Ethanol | OK412 | 90/10 | No. 8 bar coater | |
| Example 35 | +TCO | — | TSB4300 | +Ethanol | OK412 | 95/5 | No. 8 bar coater | |
| Example 36 | +TCO | — | TSB4300 | +Ethanol | OK412 | 98/2 | No. 8 bar coater | — |
| Example 37 | +TCO | — | TSB4300 | +Ethanol | TS100 | 95/5 | No. 8 bar coater | — |
| Example 38 | +TCO | — | TSB4300 | +Ethanol | TS100 | 98/2 | No. 8 bar coater | — |
| Example 39 | +TCO | — | TSB4300 | +Ethanol | TS100 | 99/1 | No. 8 bar coater | — |
| Example 40 | +TCO | — | TSB4200 | +Ethanol | EG-ST-ZL | 60/40 | No. 8 bar coater | — |
| Example 41 | +TCO | — | TSB4200 | +Ethanol | EG-ST-ZL | 60/40 | No. 8 bar coater | — |
| Example 42 | +TCO | — | TSB4200 | +Ethanol | EG-ST-ZL | 40/60 | No. 3 bar coater | — |
| Example 43 | +TCO | — | TSB4200 | +Ethanol | EG-ST-ZL | 20/80 | No. 3 bar coater | — |
| Example 44 | +TCO | +Toluene | BELCLEAN | +Curing agent | TS100 | 97/3 | No. 3 bar coater | Air dry, 10 min |
| Example 45 | +TCO | +Toluene | BELCLEAN | +Curing agent | TS100 | 97/3 | No. 8 bar coater | Air dry, 10 min. |

TABLE 10-continued

| | Glass Substrate | Substrate Pre-processing | Binder Resin | Binder Pre-processing | Particle | Mixing ratio binder/particles | Condition of application | Condition of drying |
|---|---|---|---|---|---|---|---|---|
| Example 46 | +TCO | +Toluene | BELCLEAN | +Curing agent | TS100 | 97/3 | No. 16 bar coater | Air dry, 10 min. |
| Example 47 | +TCO | +Toluene | BELCLEAN | +Curing agent | TS100 | 95/5 | No. 3 bar coater | Air dry, 10 min. |
| Example 48 | +TCO | +Toluene | BELCLEAN | +Curing agent | TS100 | 95/5 | No. 8 bar coater | Air dry, 10 min. |
| Example 49 | +TCO | +Toluene | BELCLEAN | +Curing agent | TS100 | 95/5 | No. 16 bar coater | Air dry, 10 min. |
| Comparative Example 1 | +TCO | — | — | — | — | — | — | — |
| Comparative Example 2 | Reinforced Roughened glass | — | — | — | — | — | — | — |

TABLE 11

| | Optical Characteristics Evaluation | | | Initial Film Evaluation | |
|---|---|---|---|---|---|
| | 60° gloss | 20° gloss | Full Transmittance(%) | Film thickness (μm) | X cut test |
| Example 29 | 51 | 9 | 79.1 | 1> | 10 |
| Example 30 | 40 | 9 | 80.4 | 1> | 10 |
| Example 31 | 28 | 3 | 79.8 | 1> | 10 |
| Example 32 | 21 | 1 | 79.9 | 3 | 10 |
| Example 33 | 8.3 | 0.7 | 82.1 | 1 | 10 |
| Example 34 | 40.7 | 7.7 | 81.1 | 1> | 10 |
| Example 35 | 44.7 | 13 | 80.5 | 1> | 10 |
| Example 36 | 27.7 | 4 | 81.2 | 1> | 10 |
| Example 37 | 10.3 | 0 | 81.2 | 2 | 10 |
| Example 38 | 18.7 | 1.3 | 81.2 | 1> | 10 |
| Example 39 | 41.3 | 5.7 | 79.9 | 1 | 10 |
| Example 40 | 43.3 | 1 | 78.2 | 1> | 10 |
| Example 41 | 16.7 | 0.7 | 79.1 | 1> | 8 |
| Example 42 | 3 | 0 | 79.9 | 3 | 8 |
| Example 43 | 30 | 3 | 79.2 | 1 | 10 |
| Example 44 | 21.7 | 1 | 79.1 | 2 | 10 |
| Example 45 | 14.3 | 1 | 80.0 | 1 | 10 |
| Example 46 | 13 | 0 | 78.7 | 8 | 10 |
| Example 47 | 11.3 | 0 | 80.3 | 3 | 10 |
| Example 48 | 3 | 0 | 80.0 | 3 | 10 |
| Example 49 | 2.7 | 0 | 79.3 | 11 | 10 |
| Comparative Example 1 | 90 | 83 | 80.8 | — | — |
| Comparative Example 2 | 70 | 26 | 92.4 | — | — |

TABLE 12

| | Film Evaluation After Durability Test | | | | | |
|---|---|---|---|---|---|---|
| | 85° C. × 264 h | | 85° C./85% × 270 h | | 85° C./85%~ −20° C. 10 Cycles | |
| | X cut test | Appearance | X cut test | Appearance | X cut test | Appearance |
| Example 29 | 10 | OK | 8 | OK | 2 | OK |
| Example 30 | 8 | OK | 8 | OK | 2 | OK |
| Example 31 | 10 | OK | 8 | OK | 2 | OK |
| Example 32 | 10 | OK | 10 | OK | 8 | OK |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar battery module, comprising:
a transparent insulating substrate having first and second surfaces;
a first electrode layer formed on said first surface of said transparent insulating substrate;
a photosemiconductor layer formed on said first electrode layer;
a second electrode layer formed on said photosemiconductor layer; and
an anti-glare film formed on said second surface, to which light enters, of said transparent insulating substrate; wherein
said anti-glare film includes an organic material binder and organic material particles; and
the diameter of said organic material particles is from 1 to 10 μm, and a mixing ratio of said organic material binder and said organic particles is such that the weight of said organic material particles is 1 to 10 when the weight of said organic material binder is 100.

2. The solar battery module according to claim 1, wherein said organic material binder contains an acrylic resin, a fluororesin, or mixed resin thereof.

3. The solar battery module according to claim 2, wherein the acrylic resin of said organic binder includes an acryl copolymer containing a hydrolyzable silyl, containing a group represented by the following molecule structure:

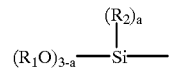

wherein $R_1$ represents an alkyl having 1 to 10 carbon atoms, $R_2$ represents a monovalent hydrocarbon group selected from the group consisting of alkyl, aryl and aralkyl having 1 to 10 carbon atoms or a hydrogen atom, and a represents 0 to 2, and said fluororesin is a fluororesin containing a hydroxyl group.

4. The solar battery module according to claim 1, wherein a catalyst is added to said organic material binder.

5. The solar battery module according to claim 4, wherein said catalyst contains an organic tin compound.

6. The solar battery module according to claim 1, wherein said organic material particles contain an acrylic resin, a fluororesin, a polyethylene wax or a mixture thereof.

7. The solar battery module according to claim 1, further comprising a film of a surfactant interposed between said transparent insulating substrate and said anti-glare film.

8. A solar battery module, comprising:
a transparent insulating substrate having first and second surfaces;

a first electrode layer formed on said first surface of said transparent insulating substrate;

a photosemiconductor layer formed on said first electrode layer;

a second electrode layer formed on said photosemiconductor layer; and an anti-glare film formed on said second surface, to which light enters, of said transparent insulating substrate; wherein said anti-glare film includes an organic material binder and inorganic material particles; and the diameter of said inorganic material particles is from 1 to 10 μm, and a mixing ratio of said organic material binder and said inorganic particles is such that the weight of said inorganic material particles is 1 to 10 when the weight of said organic material binder is 100.

9. The solar battery module according to claim 8, wherein said organic material binder contains an acrylic resin, a fluororesin, or mixed resin thereof.

10. The solar battery module according to claim 9, wherein the acrylic resin of said organic material binder includes an acryl copolymer containing a hydrolyzable silyl, containing a group represented by the following molecule structure:

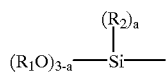

wherein R$_1$ represents an alkyl having 1 to 10 carbon atoms, R$_2$ represents a monovalent hydrocarbon group selected from the group consisting of alkyl, aryl and aralkyl having 1 to 10 carbon atoms or a hydrogen atom, and a represents 0 to 2, and said fluororesin is a fluororesin containing a hydroxyl group.

11. The solar battery module according to claim 8, wherein a catalyst is added to said organic material binder.

12. The solar battery module according to claim 11, wherein said catalyst contains an organic tin compound.

13. The solar battery module according to claim 8, wherein said inorganic material particles consist of silica.

14. The solar battery module according to claim 8, further comprising a film of a surfactant interposed between said transparent insulating substrate and said anti-glare film.

15. A solar battery module, comprising:

a transparent insulating substrate having first and second surfaces;

a first electrode layer formed on said first surface of said transparent insulating substrate;

a photosemiconductor layer formed on said first electrode layer;

a second electrode layer formed on said photosemiconductor layer; and an anti-glare film formed on said second surface, to which light enters, of said transparent insulating substrate; wherein said anti-glare film includes an inorganic material binder and organic material particles.

16. The solar battery module according to claim 15, wherein said inorganic material binder consists of silica.

17. The solar battery module according to claim 15, wherein a catalyst is added to said inorganic material binder.

18. The solar battery module according to claim 17, wherein said catalyst contains an organic tin compound.

19. The solar battery module according to claim 15, wherein said inorganic material binder is formed of alkyl silicate.

20. The solar battery module according to claim 15, wherein said inorganic material binder is formed of ethyl silicate, butyl silicate or mixtures thereof.

21. The solar battery module according to claim 15, wherein said inorganic binder is complexed with an organic material.

22. The solar battery module according to claim 15, wherein said organic material particles contain an acrylic resin, a fluororesin, a polyethylene wax, or a mixture thereof.

23. The solar battery module according to claim 15, wherein the diameter of said organic material particles is from 1 to 10 μm, and a mixing ratio of said organic material binder and said organic particles is such that the weight of said organic material particles is 1 to 10 when the weight of said inorganic material binder is 100.

24. A solar battery module, comprising:

a transparent insulating substrate having first and second surfaces;

a first electrode layer formed on said first surface of said transparent insulating substrate;

a photosemiconductor layer formed on said first electrode layer;

a second electrode layer formed on said photosemiconductor layer; and an anti-glare film formed on said second surface, to which light enters, of said transparent insulating substrate; wherein said anti-glare film includes an inorganic material binder and inorganic material particle; and the diameter of said inorganic material particles is from 1 to 10 μm, and a mixing ratio of said inorganic material binder and said inorganic particles is such that the weight of said inorganic material particles is 1 to 10 when the weight of said inorganic material binder is 100.

25. The solar battery module according to claim 24, wherein said inorganic material binder consists of silica.

26. The solar battery module according to claim 24, wherein a catalyst is added to said inorganic material binder.

27. The solar battery module according to claim 26, wherein said catalyst contains an organic tin compound.

28. The solar battery module according to claim 24, wherein said inorganic material binder is formed of alkyl silicate.

29. The solar battery module according to claim 24, wherein said inorganic material binder is formed of ethyl silicate, butyl silicate or mixtures thereof.

30. The solar battery module according to claim 24, wherein said inorganic binder is complexed with an organic material.

31. The solar battery module according to claim 24, wherein said inorganic material particles consist of silica.

32. A solar battery module, comprising:

a transparent electrode layer, a semiconductor photoelectric conversion layer and a back electrode layer stacked in order on a first main surface of a transparent insulating substrate having first and second main surfaces; and an anti-glare film formed on said second main surface of said transparent insulating substrate; wherein said anti-glare film includes an organic polymer consisting essentially of an acrylic resin, a fluororesin, or a mixed material thereof, or includes a composite of said organic polymer and an inorganic polymer, and has a surface having fine roughness suitable for scattering light; and wherein the acrylic resin includes an acryl copolymer containing a hydrolyzable silyl, containing a group represented by the following structure:

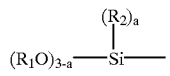

wherein $R_1$ represents an alkyl having 1 to 10 carbon atoms, $R_2$ represents a monovalent hydrocarbon group selected from the group consisting of alkyl, aryl and aralkyl having 1 to 10 carbon atoms or a hydrogen atom, and a represents 0 to 2, and said fluororesin is a fluororesin containing a hydroxyl group.

33. The solar battery module according to claim 32, wherein a catalyst is added to said anti-glare film.

34. The solar battery module according to claim 33, wherein said catalyst contains an organic tin compound.

35. The solar battery module according to claim 32, wherein alkyl silicate is used as a raw material of said inorganic polymer included in said anti-glare film.

36. The solar battery module according to claim 35, wherein said alkyl silicate contains ethyl silicate, butyl silicate or a mixed material thereof.

37. The solar battery module according to claim 32, wherein said anti-glare film includes silica obtained from said inorganic polymer.

38. The solar battery module according to claim 32, wherein a surfactant is interposed between said second main surface of said transparent insulating substrate and said anti-glare film.

39. The solar battery module according to claim 32, further comprising a dirt preventing film formed on the rough surface of said anti-glare film, said dirt preventing film having a flat surface.

40. A solar battery module comprising:

a transparent electrode layer, a semiconductor photoelectric conversion layer and a back electrode layer stacked in order on a first main surface of a transparent insulating substrate having first and second main surfaces; wherein said second main surface of said transparent insulating substrate is covered by an anti-glare film having a rough surface texture with fine roughness suitable for scattering light or processed such that the second main surface itself has said rough surface texture, said rough surface texture being covered by a surface film approximately maintaining the roughness, said surface film including an organic polymer consisting essentially of an acrylic resin, a fluororesin, or a mixed material thereof, or includes a composite of said organic polymer and an inorganic polymer; and wherein the acrylic resin includes an acryl copolymer containing a hydrolyzable silyl, containing a group represented by the following molecule structure:

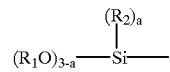

wherein $R_1$ represents an alkyl having 1 to 10 carbon atoms, $R_2$ represents a monovalent hydrocarbon group selected from the group consisting of alkyl, aryl and aralkyl having 1 to 10 carbon atoms or a hydrogen atom, and a represents 0 to 2, and said fluororesin is a fluororesin containing a hydroxyl group.

41. The solar battery module according to claim 40, wherein alkyl silicate is used as a raw material of said inorganic polymer.

42. The solar battery module according to claim 41, wherein said alkyl silicate contains ethyl silicate, butyl silicate or a mixed material thereof.

43. The solar battery module according to claim 40, wherein said inorganic polymer includes silica.

44. A solar battery module according to any of claim 1, 8, 15, 24, 32 or 40, wherein a light entering surface of said transparent substrate is covered by the anti-glare film and wherein 60° gloss of the light entering surface of said solar battery module having said anti-glare film is at most 60.

45. The solar battery module according to claim 44, wherein 60° gloss of the light receiving surface of said solar battery module having said anti-glare film is at most 45.

46. The solar battery module according to claim 44, wherein 20° gloss of the light receiving surface of said solar battery module having said anti-glare film is at most 20.

47. The solar battery module according to claim 53, wherein 20° gloss of the light receiving surface of said solar battery module having said anti-glare film is at most 10.

48. A solar battery module according to any of claim 1, 8, 15, 24, 32, or 40; wherein:

arithmetic mean roughness Ra of said anti-glare film is within the range of 0.1 to 10 μm.

49. A solar battery module, comprising:

a transparent insulating substrate having first and second surfaces;

a first electrode layer formed on said first surface of said transparent insulating substrate;

a photosemiconductor layer formed on said first electrode layer;

a second electrode layer formed on said photosemiconductor layer; and an anti-glare film formed on said second surface, to which light enters, of said transparent insulating substrate; wherein said anti-glare film includes an organic material binder and organic material particles; and the diameter of said organic material particles is less than 1 μm, and a mixing ratio of said organic material binder and said organic particles is such that the weight of said organic material particles is 100–1500 when the weight of said organic material binder is 100.

50. A solar battery module, comprising:

a transparent insulating substrate having first and second surfaces;

a first electrode layer formed on said first surface of said transparent insulating substrate;

a photosemiconductor layer formed on said first electrode layer;

a second electrode layer formed on said photosemiconductor layer; and anti glare film formed on said second surface, to which light enters, of said transparent insulating substrate; wherein said anti-glare film includes an organic material binder and inorganic material particles; and the diameter of said inorganic material particles is less than 1 $\mu$m, and a mixing ratio of said organic material binder and said inorganic particles is such that the weight of said inorganic material particles is 100–1500 when the weight of said inorganic material binder is 100.

51. A solar battery module, comprising:

a transparent insulating substrate having first and second surfaces;

a first electrode layer formed on said first surface of said transparent insulating substrate;

a photosemiconductor layer formed on said fist electrode layer;

a second electrode layer formed on said photosemiconductor layer; and an anti-glare film formed on said second surface, to which light enters, of said transparent insulating substrate; wherein said anti-glare film includes an inorganic material binder and organic material particles; and the diameter of said organic material particles is less than 1 $\mu$m, and a mixing ratio of said inorganic material binder and said organic particles is such that the weight of said organic material particles is 100–1500 when the weight of said inorganic material binder is 100.

52. A solar battery module, comprising:

a transparent insulating substrate having first and second surfaces;

a first electrode layer formed on said first surface of said transparent insulating substrate;

a photosemiconductor layer formed on said first electrode layer;

a second electrode layer formed on sad photosemiconductor layer; and an anti-glare film formed on said second surface, to which light enters, of said transparent insulating substrate; wherein said anti-glare film includes an inorganic material binder and inorganic material particles; and the diameter of said inorganic material particles is less than 1 $\mu$m, and a mixing ratio of said inorganic material binder and said inorganic particles is such that the weight of said inorganic material particles is 100–1500 when the weight of said inorganic material binder is 100.

53. A solar battery module, comprising:

a transparent electrode layers a semiconductor photoelectric conversion layer and a back electrode layer stacked in order on a first main surface of a transparent insulating substrate having first and second main surfaces; and an anti-glare film formed on said second main surface of said transparent insulating substrate; and wherein said anti-glare film includes a composite material of an organic polymer and an inorganic polymer formed from alkyl silicate, and has a surface having fine roughness suitable for scattering light.

54. The solar battery module according to claim 53, wherein said alkyl silicate contains ethyl silicate, butyl silicate or a mixture thereof.

* * * * *